(12) United States Patent
Mori

(10) Patent No.: US 11,610,298 B2
(45) Date of Patent: Mar. 21, 2023

(54) METHOD FOR DETERMINING AN ABNORMALITY AND SUBSTRATE PROCESSING SYSTEM

(71) Applicant: Tokyo Electron Limited, Tokyo (JP)

(72) Inventor: Takuya Mori, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/573,846

(22) Filed: Jan. 12, 2022

(65) Prior Publication Data

US 2022/0138930 A1 May 5, 2022

Related U.S. Application Data

(63) Continuation of application No. 16/535,484, filed on Aug. 8, 2019, now Pat. No. 11,257,206.

(30) Foreign Application Priority Data

Aug. 17, 2018 (JP) .............................. JP2018-153396

(51) Int. Cl.
*G06T 7/00* (2017.01)
*G01N 21/956* (2006.01)
(Continued)

(52) U.S. Cl.
CPC ....... *G06T 7/0008* (2013.01); *G01N 21/9501* (2013.01); *G01N 21/95607* (2013.01);
(Continued)

(58) Field of Classification Search
CPC .................. G06T 7/0008; G06T 7/001; G06T 2207/30148; H01L 21/67109;
(Continued)

(56) References Cited

U.S. PATENT DOCUMENTS

2003/0054573 A1\* 3/2003 Tanaka ............... H01L 21/67276
438/4
2008/0049219 A1\* 2/2008 Kim .................. G01N 21/95607
356/237.4
(Continued)

FOREIGN PATENT DOCUMENTS

JP 2017-028086 A 2/2017

*Primary Examiner* — Sang H Nguyen
(74) *Attorney, Agent, or Firm* — Venjuris, P.C.

(57) ABSTRACT

A method for a substrate processing system includes imaging a substrate before start and after completion of a series of processings on the substrate; specifying a first processing apparatus estimated as having a potential abnormality among a plurality of processing apparatuses; performing a first process on a first inspection substrate under a selected processing condition using the first processing apparatus specified in the specifying, and imaging the first inspection substrate before and after the performing the first process to acquire a first imaging result; performing a second process on a second inspection substrate using a second processing apparatus, and imaging the second inspection substrate for comparison before and after the performing the second process to acquire a second imaging result; and determining whether an actual abnormality exists in the first processing apparatus, based on the first imaging result and the second imaging result.

14 Claims, 13 Drawing Sheets

(51) Int. Cl.
*H01L 21/67* (2006.01)
*G01N 21/95* (2006.01)

(52) U.S. Cl.
CPC ........ *G06T 7/001* (2013.01); *H01L 21/67109* (2013.01); *H01L 21/67253* (2013.01); *H01L 21/67288* (2013.01); *G06T 2207/30148* (2013.01)

(58) Field of Classification Search
CPC ......... H01L 21/67288; H01L 21/67253; H01L 22/20; H01L 22/12; G01N 21/9501; G01N 21/95607
See application file for complete search history.

(56) References Cited

U.S. PATENT DOCUMENTS

| | | | |
|---|---|---|---|
| 2008/0172196 A1* | 7/2008 | Kang | G01N 21/9501 702/81 |
| 2010/0159372 A1* | 6/2010 | Kanaoka | H01L 21/67288 430/30 |
| 2012/0111373 A1 | 5/2012 | Arima et al. | |
| 2012/0116567 A1 | 5/2012 | Hayakawa et al. | |
| 2013/0005056 A1* | 1/2013 | Kim | H01L 22/12 356/237.4 |
| 2018/0005370 A1 | 1/2018 | Kitada et al. | |

\* cited by examiner

METHOD FOR DETERMINING AN ABNORMALITY AND SUBSTRATE PROCESSING SYSTEM

CROSS-REFERENCE TO RELATED APPLICATION

This application is a continuation application of U.S. patent application Ser. No. 16/535,484, filed on Aug. 8, 2019, which claims priority from Japanese Patent Application No. 2018-153396, filed on Aug. 17, 2018 with the Japan Patent Office, all of which are incorporated herein in their entireties by reference.

TECHNICAL FIELD

The present disclosure relates to a processing condition correction method and a substrate processing system.

BACKGROUND

Japanese Patent Laid-Open Publication No. 2017-028086 discloses a substrate processing system for forming a uniform line width. In this substrate processing system, a substrate on which a resist film is formed is imaged by an imaging unit before a pattern exposure, and the film thickness distribution of the resist film on the substrate before a pattern exposure is measured based on the imaging result. In addition, the same substrate is subjected to a pattern exposure, then subjected to a heating processing, and then imaged by the imaging unit, and the film thickness distribution of the resist film on the substrate after the heating processing is measured based on the imaging result. Then, the film thickness difference data is generated from the film thickness distribution of the resist film before a pattern exposure and the film thickness distribution of the resist film after a heating processing, and the line width of the resist pattern is estimated based on the film thickness difference data. A correction processing is performed on the resist film according to the correction conditions of the resist film based on the estimation result.

SUMMARY

According to an embodiment of the present disclosure, there is provided a method of correcting a processing condition in a substrate processing system, in which the substrate processing system includes a plurality of processing apparatuses, each of which performs a unit processing constituting a series of processings in which each of formation and removal of a layered film on a substrate is performed once or more or any one of formation and removal of a layered film is performed multiple times, and an imaging device that images the substrate. The method includes: imaging the substrate for monitoring using the imaging device before start and after completion of the series of processings on each substrate; specifying a processing apparatus estimated as having an abnormality, based on an imaging result acquired in the imaging and information on the processing apparatus used in the series of processings; performing, using the processing apparatus specified in the specifying, the unit processing in the processing apparatus on an inspection substrate under a predetermined processing condition, and imaging the inspection substrate for determining an abnormality by the imaging device before and after performing the unit processing; determining presence/absence of an actual abnormality in the processing apparatus specified in the specifying, based on an imaging result in the imaging the inspection substrate for determining an abnormality; and correcting, with respect to the processing apparatus determined as having the actual abnormality in the determining presence/absence of an actual abnormality, the processing condition of the unit processing in the processing apparatus based on the imaging result in the imaging the inspection substrate for determining an abnormality.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
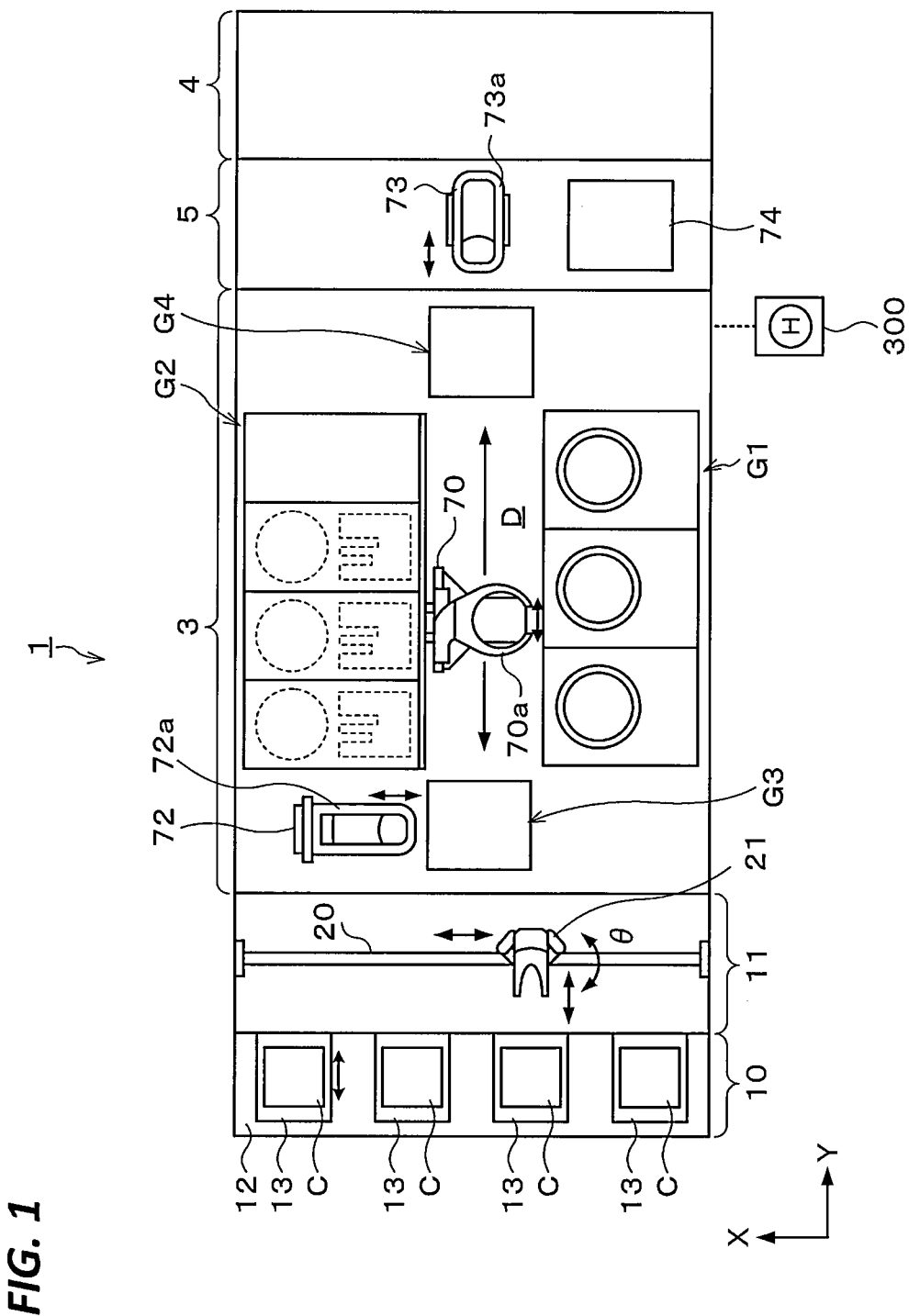
FIG. 1 is a plan view illustrating the outline of the configuration of a substrate processing system according to a first embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

In a photolithography process in a process of manufacturing a semiconductor device or the like, a series of processings are performed, and a predetermined resist pattern is formed on a semiconductor wafer (hereinafter, referred to as a "wafer") as a substrate.

The series of processings include, for example, a resist coating processing for coating a wafer with a resist liquid to form a resist film, an exposure processing of exposing the resist film, a developing processing of developing the exposed resist film, and various thermal processings. The various thermal processings include, for example, a processing for heating the resist film before exposure (a PAB processing) and a thermal processing for facilitating a chemical reaction in the resist film after exposure (a PEB processing).

The above-described resist coating processing is a spin coating processing in which a coating liquid is supplied to a wafer while rotating the wafer so as to form a coating film. The processing conditions such as, for example, the processing rotational speed of the wafer in this resist coating processing, have an influence on the film thickness of a resist film. Therefore, when the film thickness of the resist film is measured based on the imaging result by an imaging unit as in Japanese Patent Laid-open Publication No. 2017-028086, a desired film thickness may be obtained by adjusting the processing conditions concerning the resist coating processing based on the measurement result.

In addition, processing conditions such as, for example, the thermal processing temperature in the PEB processing affect the line width of the resist pattern. Therefore, when the film thickness of the resist film is measured based on the imaging result by the imaging unit and the line width of the resist pattern is estimated based on the film thickness as in Japanese Patent Laid-Open Publication No. 2017-028086, it is possible to obtain a desired line width by adjusting the processing conditions in the PEB processing based on the estimation result.

In a series of processings in the photolithography process, a lower layer film and an intermediate layer film may be formed as a base for the resist film. Specifically, respective layered films of the lower layer film, the intermediate layer film, and the resist film may be formed sequentially from the bottom so as to form a laminated film. Since it is necessary to form layered films other than the resist film to desired film thicknesses like the resist film, it is considered that the film thickness of each layered film is measured and the processing conditions for forming each layered film is adjusted based on the measurement result. However, when an imaging unit for measuring a film thickness is provided for each layered film, a substrate processing system for forming a laminated film composed of these layered films becomes expensive. In addition, assuming that imaging of a wafer is performed both before and after each layered film forming processing in order to measure the film thickness more accurately, and that different imaging units are used in both before and after each layered film forming process, the substrate processing system become more expensive. In addition, in the case in which each layered film is imaged, when imaging units are not provided for respective layered films to reduce the number of imaging units and an imaging unit is shared between different layered films, a waiting time for using the imaging unit occurs and thus productivity becomes poor.

Japanese Patent Laid-Open Publication No. 2017-028086 does not disclose or suggest anything in this regard.

Meanwhile, the respective layered films of the lower layer film, the intermediate layer film, and the resist film are formed by the above-described spin coating processing. The above-mentioned problems concerning the processing conditions such as, for example, spin coating processing, are common to, for example, adjustment of processing conditions in a processing of forming each of the above-mentioned layered films by a method other than spin coating processing, and adjustments of processing conditions in an etching processing for removing part or all of layered films.

Thus, the present disclosure makes it possible to provide a processing condition correction method and a substrate processing system that suitably correct processing conditions without deteriorating productivity even when the number of imaging devices is small. Hereinafter, a processing condition setting method and a substrate processing system according to embodiments will be described. In this specification and accompanying drawings, elements having substantially the same functional configurations will be denoted by the same reference numerals and redundant descriptions will be omitted.

First Embodiment

Figure 2:
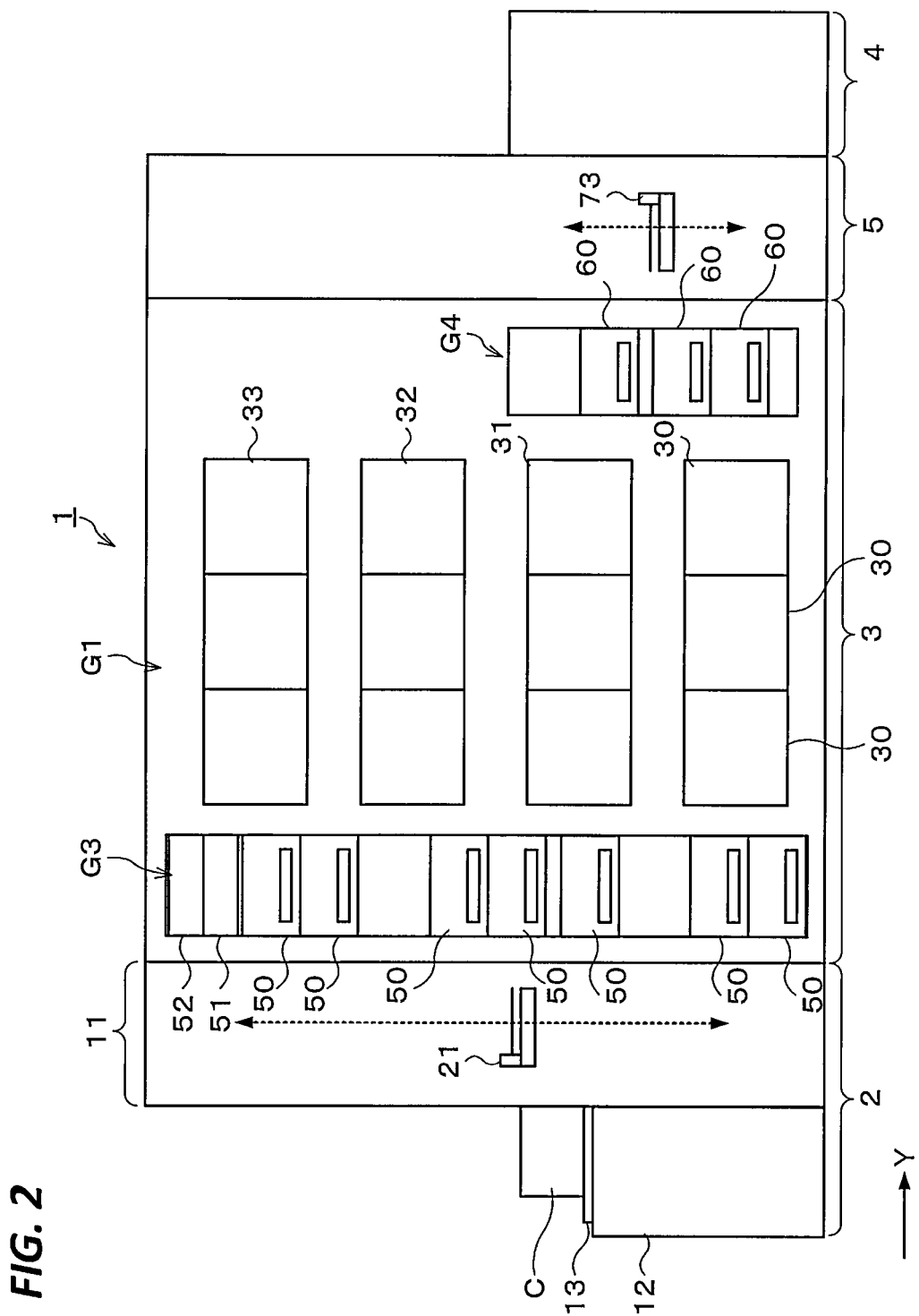
FIG. 2 is a front view illustrating the outline of the configuration of the substrate processing system according to the first embodiment.
Figure 3:
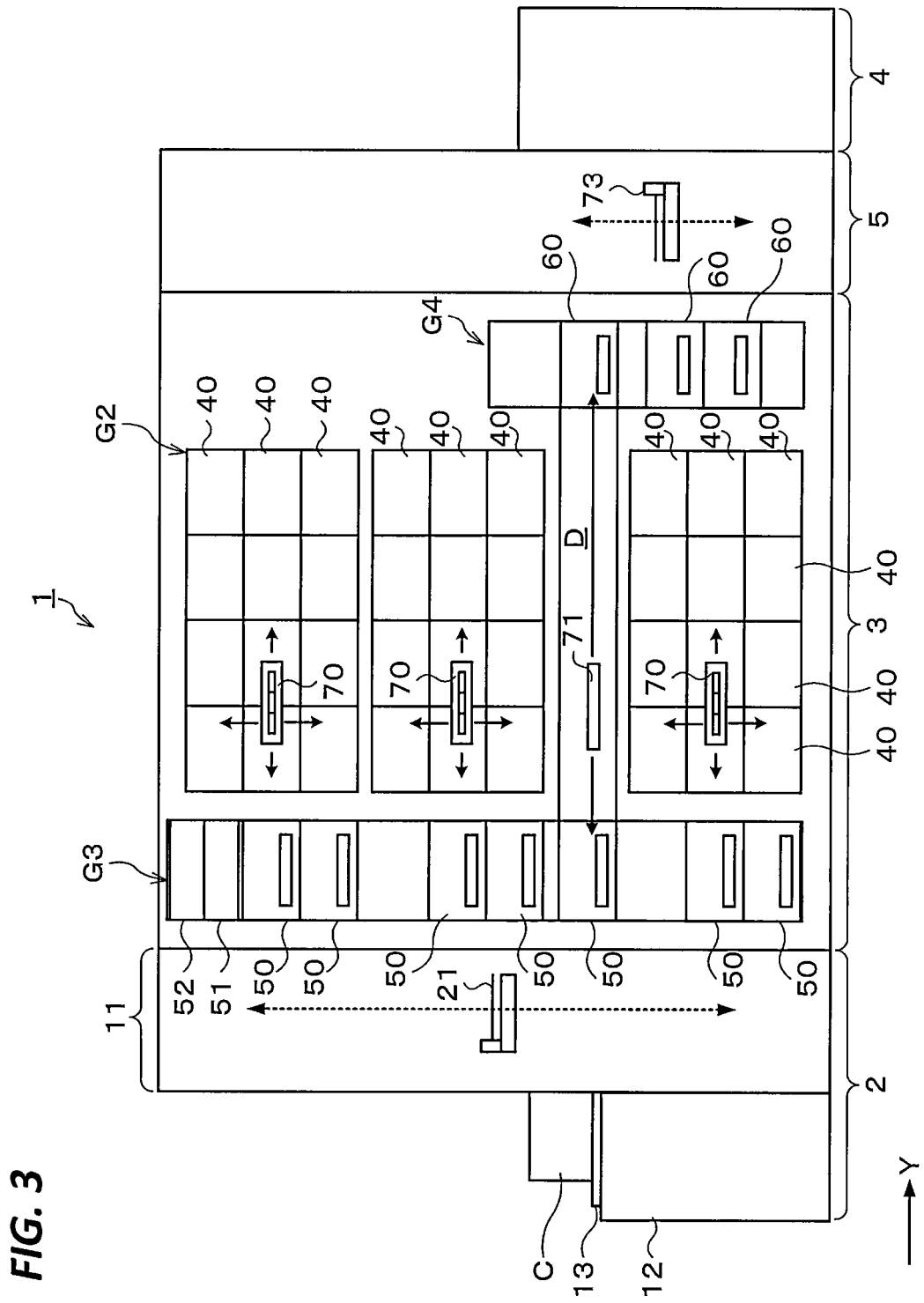
FIG. 3 is a rear view illustrating the outline of the configuration of the substrate processing system according to the first embodiment.

FIG. 1 is an explanatory view illustrating the outline of the internal configuration of a substrate processing system 1 according to a first embodiment. FIGS. 2 and 3 are a front view and a rear view, each illustrating the outline of the internal configuration of the substrate processing system 1. In the present embodiment, the case in which the substrate processing system 1 is a coating/developing processing system for performing a coating/developing processing on a wafer W will be described as an example.

The substrate processing system 1 performs a series of processings in which formation and removal of a layered film on a wafer W are performed one or more times or one of the formation and the removal is performed multiple times, so as to put the wafer W in a predetermined state. The substrate processing system 1 of this example performs, as the above-described series of processings, a coating and developing processing for forming layered films such as, for example, a lower layer film, an interlayer film, and a resist film by spin coating and developing the resist film.

As illustrated in FIG. 1, the substrate processing system 1 includes, a cassette station 2 in which a cassette containing a plurality of wafers W is loaded and unloaded, and a processing station 3 including, for each unit processing, various processing apparatuses that perform a unit processing constituting a coating and developing processing. In addition, the substrate processing system 1 has a configuration in which the cassette station 2, the processing station 3, and an interface station 5 configured to deliver a wafer W between the processing station 3 and an exposure apparatus 4 adjacent to the processing station 3 are integrally connected.

The cassette station 2 is divided into, for example, a cassette loading/unloading section 10 and a wafer transport section 11. For example, the cassette loading/unloading section 10 is provided at an end of the substrate processing system 1 on the negative side in the Y direction (left side in FIG. 1). The cassette loading/unloading section 10 is provided with a cassette stage 12. A plurality of (e.g., four) placement plates 13 are provided on the cassette stage 12. The placement plates 13 are arranged in a line in the horizontal X direction (the vertical direction in FIG. 1). When loading and unloading cassettes C with respect to the outside of the substrate processing system 1, the cassettes C may be placed on the placement plates 13.

The wafer transport section 11 is provided with a wafer transport apparatus 21 movable on the transport path 20 extending in the X direction as illustrated in FIG. 1. The wafer transport apparatus 21 is also movable in the vertical direction and around the vertical axis (in a θ direction), and is capable of transporting a wafer W between the cassette C on each cassette placement plate 13 and a delivery apparatus of a third block G3 of the processing station 3 described later.

The processing station 3 is provided with a plurality of (e.g., four) first to fourth blocks G1, G2, G3, and G4 provided with various apparatuses. For example, the first block G1 is provided on the front side (on the negative side in the X direction in FIG. 1) of the processing station 3, and the second block G2 is provided on the rear side (on the positive side in the X direction in FIG. 1) of the processing station 3. In addition, the third block G3 is provided on the cassette station 2 side (the negative side in the Y direction in FIG. 1) of the processing station 3, and the fourth block G4 is provided on the interface station 5 side (the positive side in the Y direction in FIG. 1) of the processing station 3.

The first block G1 is provided with a liquid processing apparatus as a processing apparatus. For example, as illustrated in FIG. 2, a developing apparatus 30, a lower layer film forming apparatus 31, an intermediate layer film forming apparatus 32, a resist film forming apparatus 33 are arranged in this order from the bottom. The developing apparatus 30 performs a developing processing of developing a wafer W having a resist film formed thereon by supplying a developing liquid to the wafer W after exposing the wafer W. The lower layer film forming apparatus 31 performs a lower layer film forming processing of forming a lower layer film on the wafer W by supplying a coating liquid for forming the lower layer film to the wafer W. The lower layer film is, for example, a spin on carbon (SoC) film. The intermediate layer film forming apparatus 32 performs an intermediate layer film forming processing of forming an intermediate layer film on the wafer W by supplying a coating liquid for forming the intermediate layer film to the wafer W. The intermediate layer film is, for example, a silicon-containing antireflective film (SiARC film). The resist film forming apparatus 33 performs a resist film forming processing of forming a resist film on the wafer by supplying a resist liquid to the wafer W. Each of the developing processing, the lower layer film forming processing, the intermediate layer film forming processing, and the resist film processing is an example of a unit processing constituting the coating and developing processing which corresponds to a series of processings described above.

For example, three developing apparatuses 30, three lower layer film forming apparatuses 31, three intermediate layer film forming apparatuses 32, and three resist film forming apparatuses 32 are each arranged side by side in the horizontal direction. Meanwhile, the numbers and arrangements of the developing apparatuses 30, the lower film forming apparatuses 31, the intermediate layer film forming apparatus 32, and the resist film forming apparatuses 33 may be arbitrarily selected.

In the developing apparatuses 30, the lower layer film forming apparatuses 31, the intermediate layer film forming apparatuses 32, and the resist film forming apparatuses 32, spin coating is performed for coating a predetermined processing liquid on a wafer W. In the spin coating, for example, a processing liquid is ejected from a coating nozzle onto the wafer W, and the wafer W is rotated so as to spread the processing liquid on the wafer W. Meanwhile, the configuration of the resist film forming apparatus 33 will be described later.

For example, in the second block G2, as illustrated in FIG. 3, thermal processing apparatuses 40 for performing thermal processings such as heating or cooling of the wafer W are arranged side by side in the vertical direction and in the horizontal direction. The number and arrangement of the thermal processing apparatuses 40 may be arbitrarily selected. The thermal processing apparatuses 40 include one for heating a lower layer film, one for heating an intermediate layer film, and one for a PAB processing. The thermal processing apparatus 40 for heating a lower layer film heats a wafer W on which a lower layer film is formed by the lower layer film forming apparatus 31 so as to perform a lower layer film thermal processing for curing the lower layer film. The thermal processing apparatus 40 for heating an intermediate layer film heats a wafer on which an intermediate layer film is formed by the intermediate layer film forming apparatus 32 so as to perform an intermediate layer film thermal processing for curing the intermediate layer film. The thermal processing apparatus 40 for a PAB processing heats a wafer W on which a resist film is formed by the resist film forming apparatus 33 before exposure so as to perform a PAB processing for curing the resist film. In addition, the thermal processing apparatuses 40 include a thermal processing apparatus for PB processing which performs a PB processing for heating a resist film on a wafer W after exposure and after a developing processing. Each of the thermal processing for the lower layer film, the thermal processing for the intermediate layer film, the PAB processing, the PEB processing, and the PB processing is an example of a unit processing constituting the coating and developing processing which corresponds to a series of processings described above. Meanwhile, the configurations of the thermal processing apparatuses 40 will be described later.

In the third block G3, a plurality of delivery apparatuses 50 are provided, and the inspection apparatuses 51 and 52 are provided thereon. Meanwhile, the configuration of the inspection apparatus 51 will be described later. In addition, in the fourth block G4, a plurality of delivery apparatuses 60 are provided.

As illustrated in FIG. 1, a wafer transport area D is formed in an area surrounded by the first to fourth blocks G1 to G4. In the wafer transport area D, a wafer transport apparatus 70 is disposed.

The wafer transport apparatus 70 has a transport arm 70a movable, for example, in a Y direction, a front-and-rear direction, a θ direction, and an up-and-down direction. The wafer transport apparatus 70 is capable of moving within the wafer transport area D so as to transport a wafer W to a predetermined apparatus in the first block G1, the second block G2, the third block G3, and the fourth block G4 around the wafer transport area D. For example, as illustrated in FIG. 3, a plurality of wafer transport apparatuses 70 are vertically arranged, and are each capable of transporting a wafer W to, for example, predetermined apparatuses having substantially the same height in each of the blocks G1 to G4.

In addition, in the wafer transport area D, a shuttle transport apparatus 71 configured to linearly transport a wafer W between the third block G3 and the fourth block G4 is provided.

The shuttle transport apparatus 71 is configured to be linearly movable, for example, in the Y direction in FIG. 3. The shuttle transport apparatus 71 moves in the Y direction in the state of supporting a wafer W, and is capable of transporting the wafer W between a delivery apparatus 50 and a delivery apparatus having substantially the same height in the third block G3 and the fourth block G4.

As illustrated in FIG. 1, a wafer transport apparatus 72 is provided on the positive side in the X direction of the third block G3. The wafer transport apparatus 72 has a transport arm 72*a*, which is movable, for example, in the front-and-rear direction, the θ direction, and the up-and-down direction. The wafer transport apparatus 72 is capable of moving up and down in the state of supporting a wafer W so as to transport the wafer W to each delivery apparatus 50 in the third block G3.

The interface station 5 is provided with a wafer transport apparatus 73 and a delivery apparatus 74. The wafer transport apparatus 73 has a transport arm 73*a*, which is movable, for example, in the Y direction, the θ direction, and the up-and-down direction. The wafer transport apparatus 73 is capable of supporting a wafer W, for example, on the transport arm 73*a* and capable of transporting the wafer W among each of the delivery apparatuses 60 in the fourth block G 4, the delivery apparatus 74, and the exposure apparatus 4.

Figure 4:
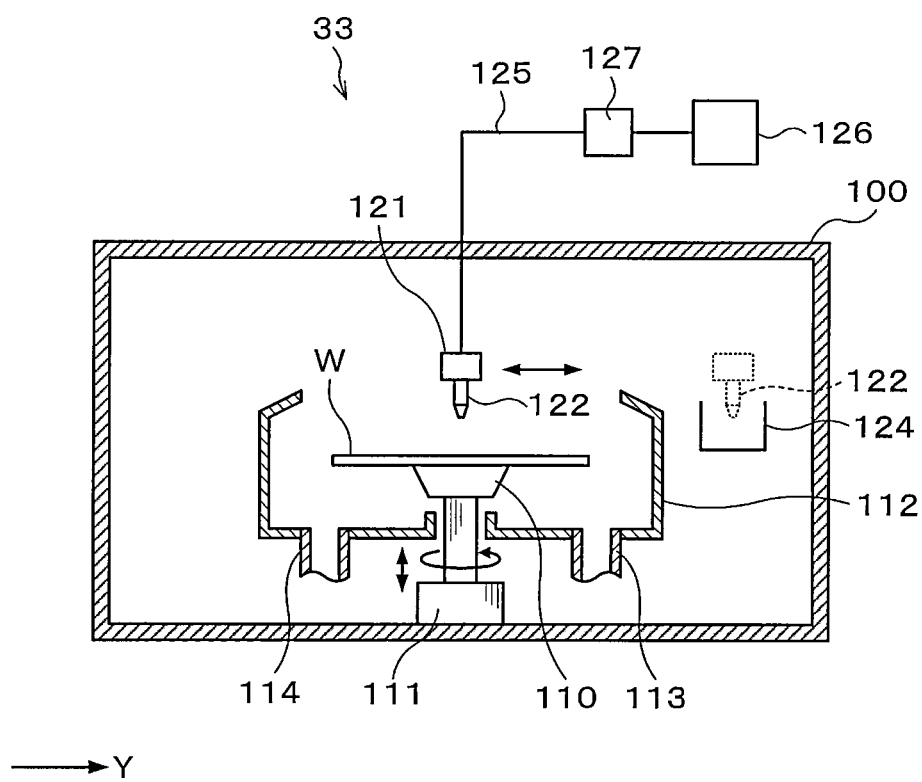
FIG. 4 is a vertical cross-sectional view illustrating the outline of the configuration of a resist coating apparatus.
Figure 5:
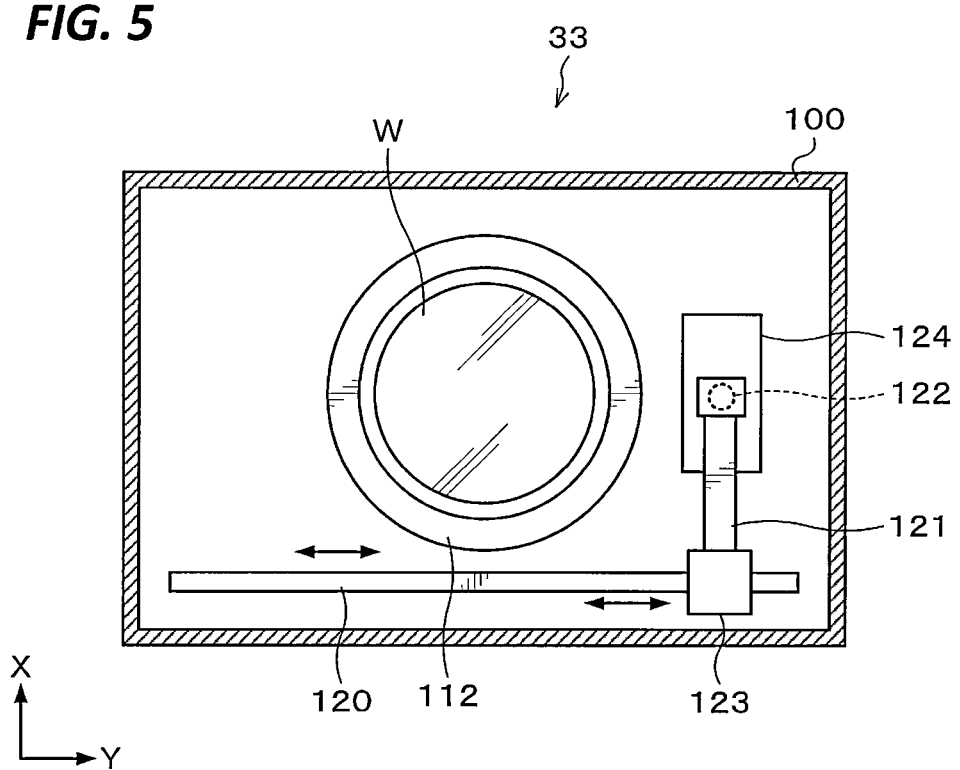
FIG. 5 is a horizontal cross-sectional view illustrating the outline of the configuration of the resist coating apparatus.

Next, the configuration of the above-described resist film forming apparatus 33 will be described. FIGS. 4 and 5 are a vertical cross-sectional view and a horizontal cross-sectional view, respectively, each of which illustrates the outline of the configuration of the resist film forming apparatus 33.

As illustrated in FIGS. 4 and 5, the resist film forming apparatus 33 has a processing container 100 the interior of which is capable of being sealed. A wafer loading/unloading port (not illustrated) is formed in the side wall of the processing container 100 on the wafer transport apparatus 70 side, and an opening/closing shutter (not illustrated) is provided for the loading/unloading port.

In the central portion inside the processing container 100, a spin chuck 110 for holding and rotating a wafer W is provided. The spin chuck 110 has a horizontal upper surface, and a suction port (not illustrated) for suctioning, for example, a wafer W, for example, is provided on the upper surface. The wafer W is capable of being attracted and held on the spin chuck 110 by suction from the suction port.

Below the spin chuck 110, for example, a chuck drive 111 including, for example, a motor is provided. The spin chuck 110 is rotatable at a predetermined speed by the chuck drive 111. In addition, the chuck drive 111 is provided with a lifting driving source such as, for example, a cylinder, and the spin chuck 110 is configured to be movable up and down.

Around the spin chuck 110, a cup 112 is provided to receive and recover the liquid scattered or dropped from the wafer W. Connected to the lower surface of the cup 112 are a discharge pipe 113 for discharging the collected liquid, and an exhaust pipe 114 for evacuating and exhausting the atmosphere in the cup 112.

As illustrated in FIG. 5, a rail 120 extending in the Y direction (in the left-and-right direction in FIG. 5) is formed on the negative side of the cup 112 in the X direction (the lower side in FIG. 5). The rail 120 is formed, for example, from the outer side of the cup 112 on the negative side in the Y direction (the left side in FIG. 5) to the outer side on the positive side in the Y direction (the right side in FIG. 5). An arm 121 is attached to the rail 120.

On the arm 121, as illustrated in FIGS. 4 and 5, a coating nozzle 122 is supported to supply a resist liquid onto the wafer W. The arm 121 is movable on the rail 120 by a nozzle drive 123 illustrated in FIG. 5. As a result, the coating nozzle 122 is movable from a standby portion 124 provided outside on the positive side in the Y direction of the cup 112 to the upper side of the central portion of the wafer W in the cup 112. Further, the coating nozzle is movable on the wafer W in the radial direction of the wafer W. In addition, the arm 121 is capable of being raised and lowered by the nozzle drive 123, and the height of the coating nozzle 122 is adjustable.

As illustrated in FIG. 4, a supply pipe 125 for supplying a resist liquid to the coating nozzle 122 is connected to the coating nozzle 122. The supply pipe 125 is in communication with a resist liquid supply source 126 for storing the resist liquid therein. In addition, the supply pipe 125 is provided with a supply apparatus group 127 including, for example, a valve or a flow rate controller for controlling the flow of the resist liquid.

Meanwhile, the configurations of the developing apparatus 30, the lower layer film forming apparatus 31, and the intermediate layer film forming apparatus 32 are the same as the configuration of the resist film forming apparatus 33 described above. However, the processing liquid supplied from the coating nozzle in, for example, the developing apparatus 30 and the processing liquid supplied from the coating nozzle in the resist film forming apparatus 33 are different from each other.

Figure 6:
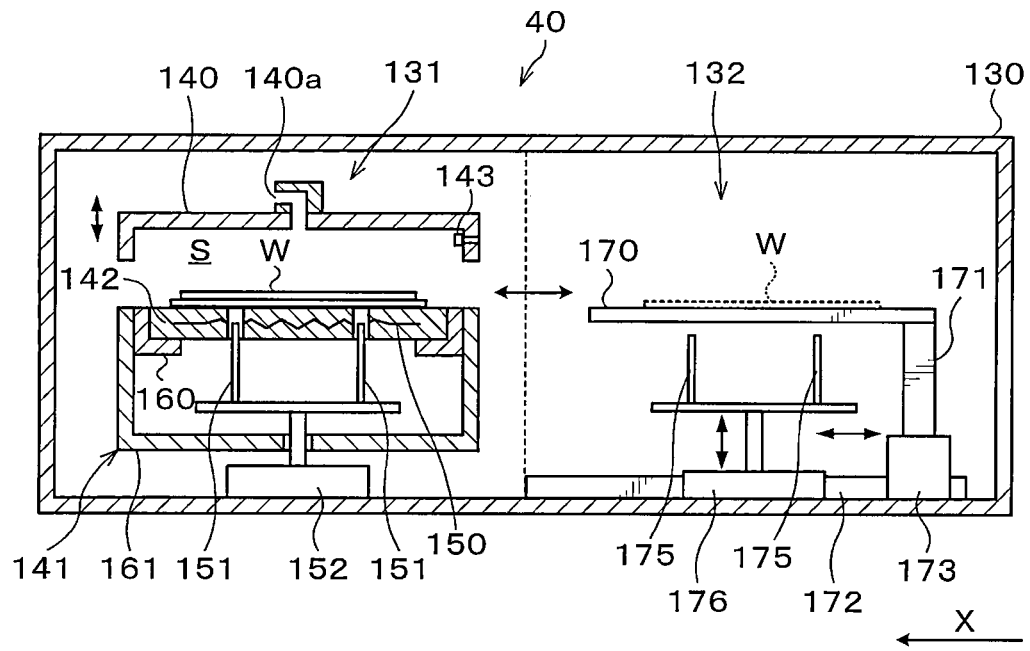
FIG. 6 is a vertical cross-sectional view illustrating the outline of the configuration of a thermal processing apparatus.
Figure 7:
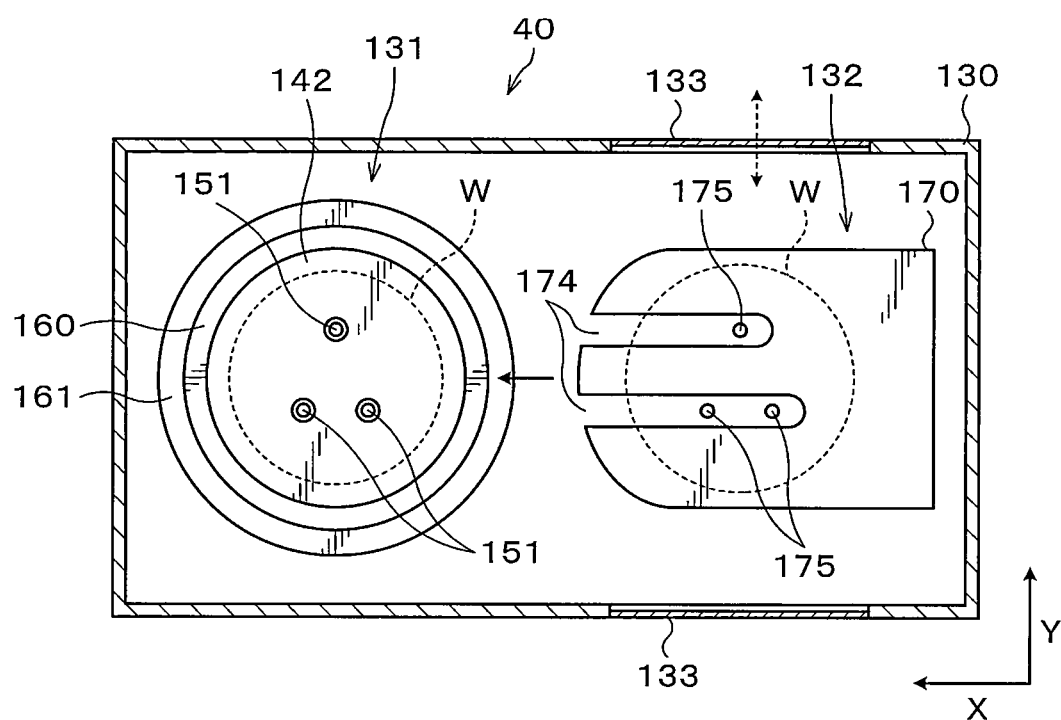
FIG. 7 is a horizontal cross-sectional view illustrating the outline of the configuration of the thermal processing apparatus.

Next, the configuration of the thermal processing apparatus 40 described above will be described. FIGS. 6 and 7 are a vertical cross-sectional view and a horizontal cross-sectional view, respectively, each of which illustrates the outline of the configuration of the thermal processing apparatus 40.

For example, as illustrated in FIGS. 6 and 7, the thermal processing apparatus 40 includes, in the casing 130 thereof, a heating unit 131 configured to heat a wafer W and a cooling unit 132 configured to cool the wafer W. As illustrated in FIG. 7, loading/unloading ports 133 for loading/unloading a wafer W are formed in opposite side walls of the casing 130 near the cooling unit 132.

As illustrated in FIG. 6, the heating unit 131 includes a cover 140 located at the upper side and configured to move up and down, and a heating plate accommodation unit 141 located at the lower side and configured to form a processing chamber S integrally with the cover 140.

The cover 140 has a substantially cylindrical bottom-opened shape, and covers the upper surface as the surface to be processed of the wafer W placed on a heating plate 142 described later. An exhaust portion 140*a* is provided in the central portion of the upper surface of the cover 140. The atmosphere in the processing chamber S is exhausted from the exhaust portion 140*a*.

In addition, the cover 140 is provided with a temperature sensor 143 which is a temperature measuring unit configured to measure the temperature of the cover 140. In the example of the drawing, the temperature sensor 143 is provided at an end of the cover 140, but may be provided in, for example, the central portion of the cover 140.

The wafer W is placed in the center of the heating plate accommodation unit 141, and the heating plate 142 is provide to heat the placed wafer W. The heating plate 142 has a thick and substantially disk-like shape, and a heater 150 is provided therein to heat the upper surface of the heating plate 142, that is, the wafer W placement surface. For example, an electric heater is used as the heater 150. The configuration of the heating plate 142 will be described later.

The heating plate accommodation unit 141 is provided with lift pins 151 which penetrate the heating plate 142 in the thickness direction. The lift pins 151 are capable of being raised and lowered by a lifting drive 152 such as, for example, a cylinder, and are capable of protruding on the upper surface of the heating plate 142 to deliver a wafer W with a cooling plate 170 described later.

For example, as illustrated in FIG. 6, the heating plate storage portion 141 has an annular holding member 160 configured to accommodate the heating plate 142 and hold the outer peripheral portion of the heating plate 142, and a substantially cylindrical support ring 161 surrounding the outer periphery of the holding member 160.

In the cooling unit 132 adjacent to the heating unit 131, a cooling plate 170 is provided so as to cool, for example, a wafer W placed thereon. For example, as illustrated in FIG. 7, the cooling plate 170 has a substantially rectangular flat plate shape, and the end face on the heating part 131 side is curved in an arc shape. Inside the cooling plate 170, for example, a cooling member (not illustrated) such as, for example, a Peltier element, is incorporated, and the temperature of the cooling plate 170 is capable of being adjusted to a predetermined set temperature.

The cooling plate 170 is supported on a support arm 171, for example, as illustrated in FIG. 6, and the support arm 171 is attached to a rail 172 extending to the heating unit 131 side in the X direction. The cooling plate 170 is movable on the rail 172 by a drive mechanism 173 attached to the support arm 171. Thus, the cooling plate 170 is movable to the upper side of the heating plate 142 on the heating unit 131 side.

The cooling plate 170 is formed with, for example, two slits 174 in the X direction in FIG. 7. The slits 174 are formed from the heating unit 131 side end surface of the cooling plate 170 to the vicinity of the central portion of the cooling plate 170. The slits 174 prevent interference between the cooling plate 170 moved to the heating unit 131 side and the lift pins 151 on the heating plate 142. As illustrated in FIG. 6, the lift pins 175 are provided below the cooling plate 170 located in the cooling unit 132. The lift pins 175 are capable of being raised and lowered by a lifting drive 176. The lift pins 175 are raised from the lower side of the cooling plate 170, pass through the slits 174, protrude to the upper side of the cooling plate 170, for example, so as to perform the delivery of a wafer W between the lift pins 175 and the wafer transport apparatus 70 entering the inside of the casing 130 from the loading/unloading port 133.

Figure 8:
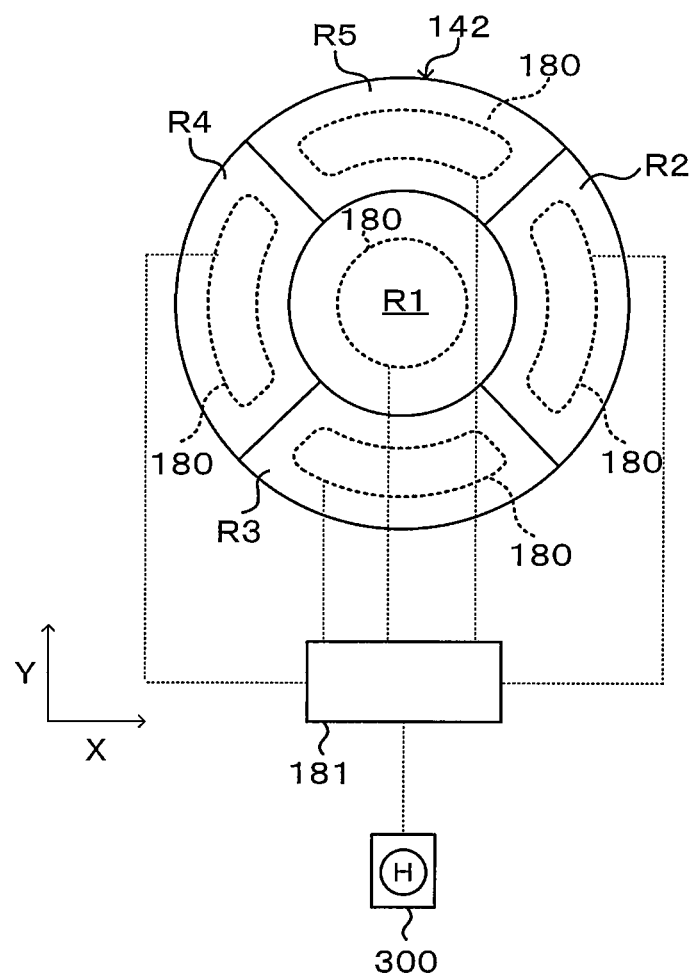
FIG. 8 is a plan view illustrating the outline of the configuration of a heating plate of the thermal processing apparatus.

Next, the configuration of the heating plate 142 will be described in detail. FIG. 8 is a plan view illustrating the outline of the configuration of the heating plate 142. As illustrated in FIG. 8, the heating plate 142 is divided into a plurality of (e.g., five) heating plate regions R1 to R5. For example, the heating plate 142 is divided into a heating plate region R1 located in the central portion in a plan view and having a circular shape and heating plate region R2 to R5 obtained by equally dividing the periphery of the heating plate region R1 into four arcs.

A heater 180 is individually incorporated in each of the heating plate regions R1 to R5 of the heating plate 142, and thus it is possible to individually heat the heating plate regions R1 to R5. The calorific value of the heater 180 of each of the heating plate regions R1 to R5 is adjusted by, for example, a temperature control device 181. The temperature control device 181 is capable of controlling the processing temperature of each of the heating plate regions R1 to R5 to a predetermined set temperature by adjusting the calorific value of each heater 180. The temperature setting in the temperature control device 181 is performed by the controller 300.

Figure 9:
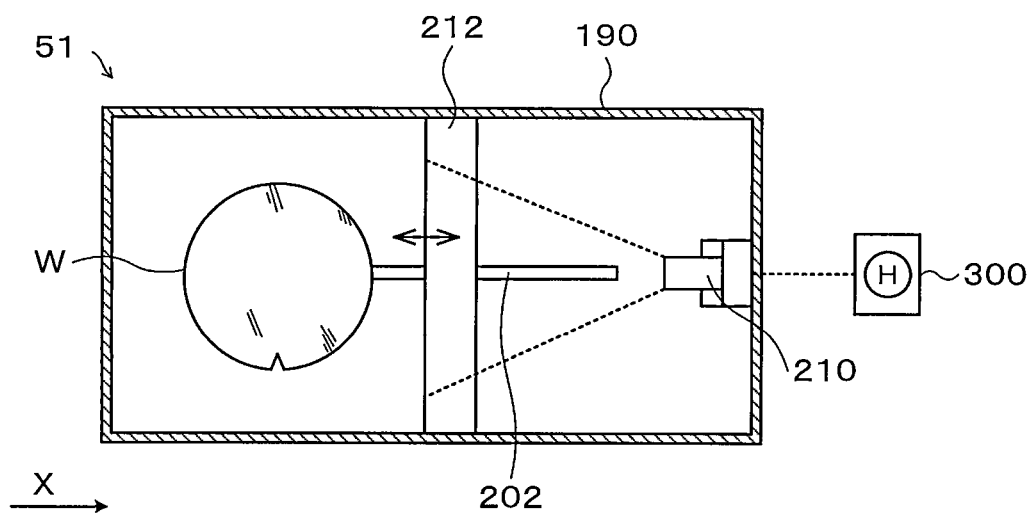
FIG. 9 is a vertical cross-sectional view illustrating the outline of the configuration of the inspection apparatus.
Figure 10:
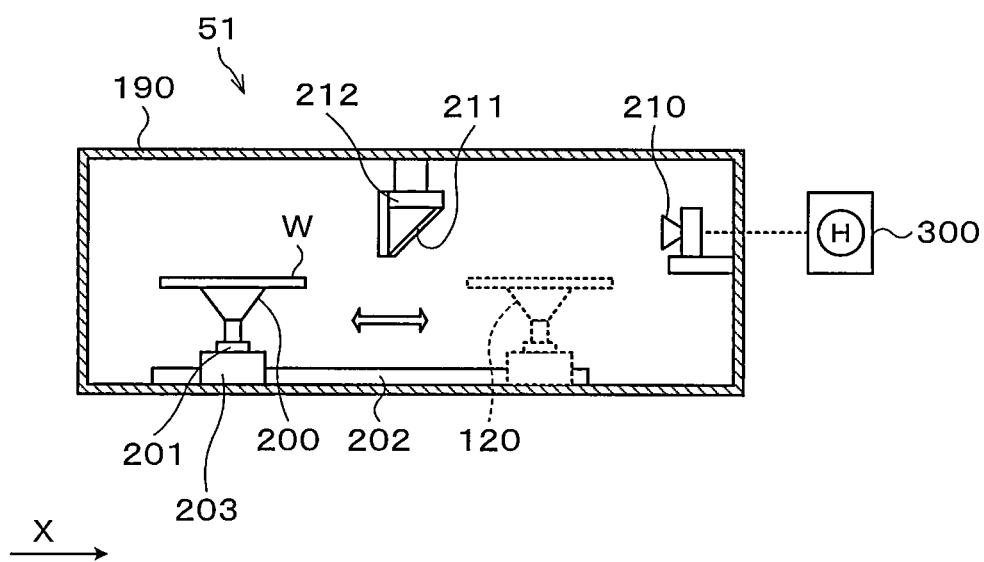
FIG. 10 is a horizontal cross-sectional view illustrating the outline of the configuration of the inspection apparatus.

Next, the configuration of an inspection apparatus 51 will be described. FIGS. 9 and 10 are a vertical cross-sectional view and a horizontal cross-sectional view, respectively, each of which illustrates the outline of the configuration of the inspection apparatus 51. The inspection apparatus 51 has a casing 190 as illustrated in FIGS. 9 and 10. In the casing 190, a stage 200 on which the wafer W is placed is provided. The stage 200 is capable of being rotated and stopped by a rotary drive 201 such as, for example, a motor. A guide rail 202 is provided on the bottom surface of the casing 190 to extend from one end side (the negative side in the X direction in FIG. 10) to the other end side (the positive side in the X direction in FIG. 10). The stage 200 and the rotary drive 201 are provided on the guide rail 202 and are movable along the guide rail 202 by a drive device 203.

An imaging device 210 is provided on the side surface on the other end side (the positive side in the X direction in FIG. 10) in the casing 190. For the imaging device 210, for example, a wide-angle CCD camera is used.

Near the upper center of the casing 190, a half mirror 211 is provided. The half mirror 211 is provided at a position facing the imaging device 210 in the state of being inclined 45 degrees upward toward the imaging device 210 from the state in which the mirror surface thereof is directed vertically downward. A lighting device 212 is provided above the half mirror 211. The half mirror 211 and the lighting device 212 are fixed to the inner upper surface of the casing 190. The lighting from the lighting device 212 is lighted downward through the half mirror 211. Therefore, the light reflected by an object below the lighting device 212 is further reflected by the half mirror 211 and received by the imaging device 210. That is, the imaging device 210 is capable of imaging an object which is present in the region lighted by the lighting device 212.

Meanwhile, the configuration of the inspection apparatus 52 is the same as the configuration of the inspection apparatus 51 described above.

The substrate processing system 1 described above is provided with a controller 300 as illustrated in FIG. 1. The controller 300 is configured with, for example, a computer including, for example, a CPU and memory, and has a program storage unit (not illustrated). The program storage unit stores a program for controlling the processing of a wafer W in the substrate processing system 1, including a program for correcting the processing conditions of a unit processing constituting a series of processings described above. Meanwhile, the programs described above may be recorded in a computer-readable storage medium H, and may be installed in the controller 300 from the storage medium H.

Figure 11:
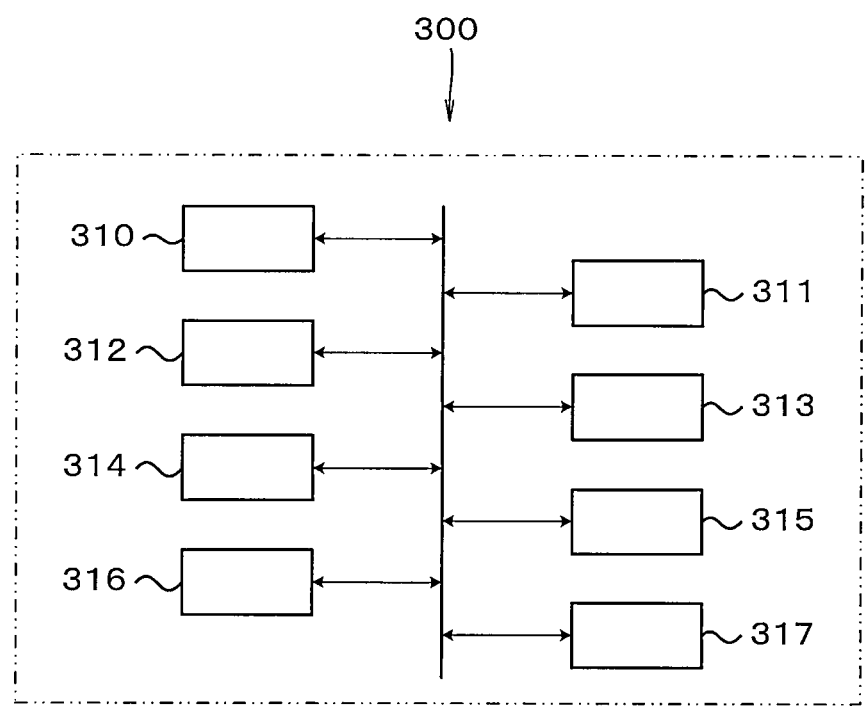
FIG. 11 is a block diagram schematically illustrating the outline of the configuration of a controller.

In addition, as illustrated in FIG. 11, the controller 300 has a storage unit 310, a first acquisition unit 311, an apparatus specification unit 312, a second acquisition unit 313, a third acquisition unit 314, and an abnormality presence/absence determination unit 315, a processing condition correction unit 316, and a correction suitability determination unit 317.

The storage unit 310 stores various types of information. In the substrate processing system 1, as a series of processes described above, coating and developing processing is performed in which a laminated film of a lower layer film, an intermediate layer film, and a resist film is formed and the resist film after exposure is developed. The storage unit 310 stores, for each wafer W, information of the processing apparatuses used in the coating and developing processing (hereinafter, referred to as "history information"). The history information is, in other words, transport path information indicating, for example, which lower layer film apparatus 31 among the plurality of lower layer film forming apparatuses 31 has passed during the coating and developing processing.

The first acquisition unit 311 acquires, for each wafer W, the imaging result of the wafer W before the coating and developing processing is started and the imaging result of the wafer W after the coating and developing processing is completed, from the inspection apparatus 51 or the imaging device 210 of the inspection apparatus 52.

The apparatus specification unit 312 specifies an apparatus estimated to have an abnormality (an estimated abnormal apparatus A) based on the imaging results before and after the start of the coating and developing processing acquired by the first acquisition unit 311 and the history information/transport path information stored for each wafer W. The reason for using not only the imaging result of the wafer W after the completion of the coating and developing processing but also the imaging result of the wafer W before the start of the coating and developing processing is to exclude the case in which a wafer W is abnormal before the start of the coating and developing processing.

The second acquisition unit 313 controls the estimated abnormal apparatus A to cause a unit processing A in the apparatus to be performed on an inspection wafer W under predetermined processing conditions. Meanwhile, the predetermined processing conditions are the same processing conditions as those in the coating and developing processing. Then, the second acquisition unit 313 acquires the imaging result of the inspection wafer W before the unit processing A is performed and the imaging result of the inspection wafer W after the unit processing A is performed by the estimated abnormal apparatus A from the inspection apparatus 51 or the imaging device 210 of the inspection apparatus 52.

The third acquisition unit 314 controls another processing apparatus of the same type (the other same-type processing apparatus A*) that performs the same unit process A as the estimated abnormal apparatus A to perform the unit processing A under the predetermined processing conditions. Then, the third acquisition unit 314 acquires the imaging result of the inspection wafer W before the unit processing A is performed from the imaging device 210 of the inspection apparatus 51. In addition, the imaging result of the inspection wafer W after the unit processing A is performed by the other same-type processing device A* is also acquired from the imaging device 210 of the inspection apparatus 52.

The abnormality presence/absence determination unit 315 determines the presence/absence of an actual abnormality in the estimated abnormal apparatus A based on the imaging results acquired by the second acquisition unit 313. For example, the abnormality presence/absence determination unit 315 determines the presence/absence of an actual abnormality based on the imaging results before and after the unit processing A performed by the estimated abnormal apparatus A acquired by the second acquisition unit 313 and the imaging result before and after the unit processing A performed by the other same-type processing apparatus A*. The reason for using not only the imaging result of the inspection wafer W before the unit processing A but also the imaging result of the inspection wafer W after the unit processing A is to exclude the case in which an abnormality occurs in the inspection wafer before the unit processing A.

Then, the processing condition correction unit 316 corrects the processing conditions of the unit processing A by the following method with respect to the estimated abnormal apparatus A (abnormal apparatus A#) that is determined to actually have an abnormality.

It has been known that there is a correlation between RGB data of a captured image based on an imaging result by an imaging device 210 and the film thickness of a resist film (see Japanese Patent Laid-open Publication No. 2017-028086).

In addition, according to the thorough study performed by the present inventors, it was found that there is a correlation between RGB data of a captured image based on an imaging result by the imaging device 210 and a line width of a resist pattern on a wafer W.

FIGS. 12A to 12D are views showing that there is a correlation between RGB data of a captured image by the imaging device 210 and a line width of a resist pattern on a wafer W. Meanwhile, in each of FIGS. 12A to 12D, respective images I1 to I4 are illustrated in gray scale, but they are actually color images.

Figure 12A:
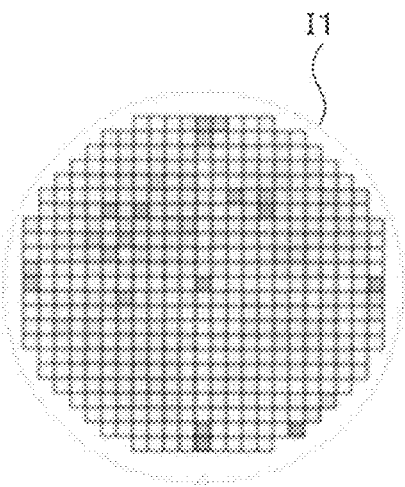
FIGS. 12A to 12D are views illustrating that there is a correlation between a line width of a resist pattern on a wafer and an imaging result using an imaging device.
Figure 12B:
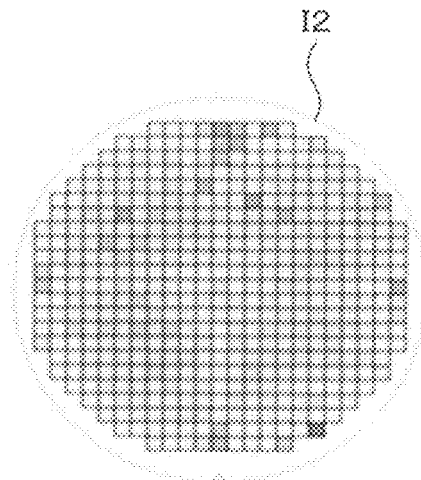
Figure 12C:
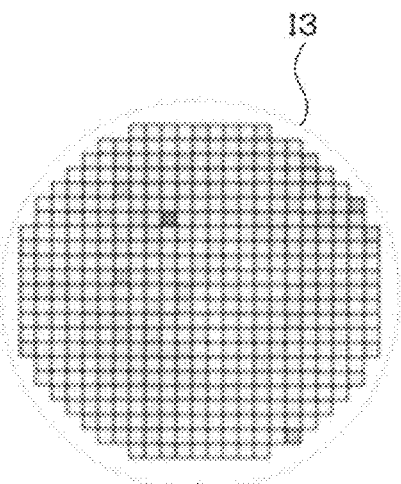

The images I1 and I3 in FIGS. 12A and 12C are acquired as follows. That is, a wafer W on which a resist pattern is formed is divided into 437 regions, and in each region, the line width of a resist pattern on the region is measured by SEM, and the average value of the line widths is calculated for each region. In addition, the calculated average value of line widths is converted into RGB data. The RGB data is data including a pixel value/luminance value of each of R (red), G (green), and B (blue). Then, for each region, a table is created in which the coordinates of the region and the RGB data converted from the average values of the line widths are associated with each other. Based on the table, RGB images I1 and I3 showing distributions of line widths of resist patterns as illustrated in FIGS. 12A and 12C are obtained.

Figure 12D:
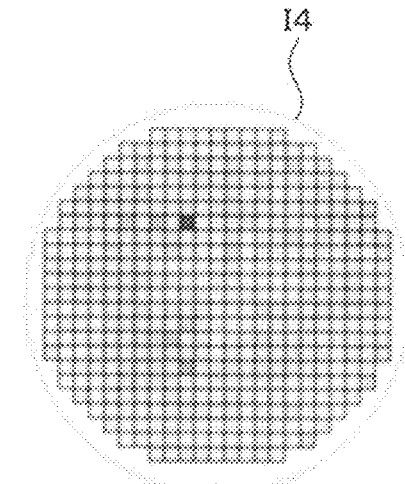

The images I2 and I4 in FIGS. 12B and 12D are acquired as follows. That is, an entire wafer W on which a resist pattern is formed is imaged using the imaging device 210 of the inspection apparatus 51. Then, the wafer W is divided into 437 regions, and in each region, the average value of the pixel values of each of R, G, and B in the pixels included in the region is calculated. Then, for each region, a table is created in which the coordinates of the region are associated with the average values of the pixel values, that is, the average values of RGB data. Then, the table is calibrated in accordance with, for example, the optical system in the inspection apparatus 51. Based on the calibrated table, RGB images I2 and I4 as illustrated in FIGS. 12B and 12D are acquired. Herein, a "captured image" refers to, for example, an image obtained as described above from the imaging results of the imaging device 210.

Meanwhile, the processing conditions (including various processing apparatuses used) for wafers W are the same in FIG. 12A and FIG. 12B, and are also the same in FIG. 12C and FIG. 12D. However, the processing conditions for wafers W are different between FIG. 12A and FIG. 12C.

The color distribution is the same between the image I1 of FIG. 12A and the image I2 of FIG. 12B, and the color distribution is also the same between the image I3 of FIG. 12C and the image I3 of FIG. 12D. From this, it is obvious that there is a correlation between color information in the captured image indicating the state of the surface of the wafer W, that is, RGB data, obtained from the imaging result using the imaging device 210, and the line width of the resist pattern on the wafer W.

As described above, there is a correlation between the RGB data of the captured image by the imaging device 210 and the film thickness of the resist film, and there is a correlation between the RGB data of the captured image by the imaging device 210 and the line width of the resist pattern on the wafer W.

Therefore, the processing condition correction unit 316 corrects the processing condition in the abnormal apparatus A# using a correlation model between the change amounts of RGB data in the captured image and the change amounts of the processing condition, and based on the imaging results acquired by the second acquisition unit 313.

The correction suitability determination unit 317 controls the abnormal apparatus A# to perform the unit processing A on an inspection wafer W under the processing condition after the correction. Then, the correction suitability determination unit 317 acquires the imaging result of the inspection wafer W after the unit processing A based on the processing condition after correction, and determines whether or not the correction by the processing condition correction unit 316 is suitable based on the imaging result.

Figure 13:
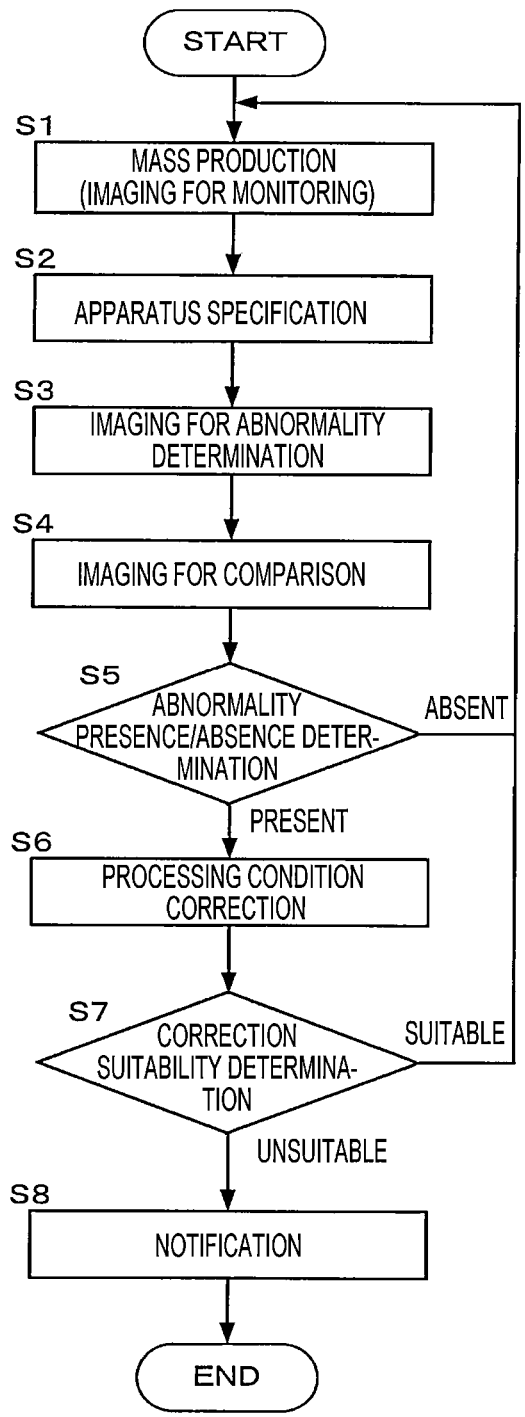
FIG. 13 is a flowchart for explaining an wafer processing according to the first embodiment.

Hereinafter, a wafer processing including the correction processing of a processing condition according to the present embodiment will be described. FIG. 13 is a flowchart for describing an wafer processing.

<1. Mass Production Process (Imaging Process for Monitoring)>

In the wafer processing according to the present embodiment, a coating and developing processing is performed on mass production wafers W (step S1). In this process, the imaging devices 210 of the inspection apparatuses 51 and 52 capture an image of each of the mass production wafers W before the start of the coating and developing processing and after the completion of the coating and developing processing.

Specifically, first, the mass production wafers W are sequentially taken out from a cassette C on the cassette stage 12 and transported to the inspection apparatus 51 of the third block G3 of the processing station 3. Then, the mass production wafers W before the start of the coating and developing processing are imaged by the imaging device 210, and the captured images of the mass production wafers W are acquired by the first acquisition unit 311.

Thereafter, the mass production wafers W are transported to the lower layer film forming apparatuses 31 of the first block G1, and a lower layer film is formed on each of the wafers W. Next, the mass production wafers W are transported to the thermal processing apparatuses 40 for heating the lower layer film, and subjected to a heating processing.

Thereafter, the mass production wafers W are transported to the intermediate layer film forming apparatuses 32, and an intermediate layer film is formed on the lower layer film of each of the wafers W. Next, the mass production wafers W are transported to the thermal processing apparatuses 40 for an intermediate layer film, and subjected to a heating processing.

Thereafter, the mass production wafers W are transported to the resist film forming apparatuses 33, and a resist film is formed on each of the mass production wafers W. Next, the mass production wafers W are transported to the thermal processing apparatuses 40 for a PAB processing, and subjected to the PAB processing.

Thereafter, the mass production wafers W are transported to the exposure apparatus 4, and subjected to an exposure processing in a predetermined pattern.

Next, the mass production wafers W are transported to the thermal processing apparatuses 40 for a PEB processing, and subjected to the PEB processing. Thereafter, the mass production wafers W are transported to the developing apparatus 30, and subjected to a developing processing. After the completion of the developing processing, the mass production wafers W is transported to the thermal processing apparatuses 40 for a post-baking processing, and subjected to the post-baking processing. As a result, the coating and developing processing is completed. Then, the mass production wafers W are transported to the inspection apparatus 52, the mass production wafers W after the completion of the coating and developing processing are imaged by the imaging device 210, and the captured images of the mass production wafers W are acquired by the first acquisition unit 311. Thereafter, the mass production wafers W are transported to a cassette C on the cassette stage 12, and a series of photolithography processes on the mass production wafers W are completed. A series of photolithography processes described above are performed on all the mass production wafers W.

<2. Apparatus Specification Process>

Before the mass production process, the processing condition in each processing apparatus is adjusted to be appropriate. However, while the operation is continued, the processing condition may become inadequate in some processing apparatuses. Therefore, after the above-described mass production process or in parallel with the mass production process, specification of an estimated abnormal apparatus A is performed based on a captured image for each of the mass production wafers W, which is acquired by the first acquisition unit 311, and information on processing apparatuses used for a series of processings (step S2).

Specifically, first, for each of the mass production wafers W, based on the captured image before the start of the coating and developing processing and the captured image after the completion of the coating and developing processing, which are acquired by the first acquisition unit 311, estimated abnormal wafers W are specified. The estimated abnormal wafers W are mass production wafers W which are estimated to have undergone an abnormal unit processing.

The first acquisition unit 311 specifies, for example, mass production wafers W satisfying both the following items (P) and (Q) as estimated abnormal wafers W.

(P) When there is no difference between a captured image before the start of the coating and developing processing and a first reference image.

(Q) When there is a difference between a captured image after the completion of the coating and developing processing and a second reference image.

The first reference image is, for example, an average image of captured images of mass production wafers W before the start of the coating and developing processing, and the second reference image is, for example, an average image of captured images of mass production wafers W after the coating and developing processing is completed.

In the above items (P) and (Q), "there is no difference/there is a difference" means, for example, that a difference in pixel value at each coordinate of the images is present/is not present within a predetermined range between the captured image and the reference image.

Then, based on history information concerning the mass production wafers W specified as estimated abnormal wafers W, that is, based on the information on the processing apparatuses used in the coating and developing processing of the mass production wafers W, an estimated abnormal apparatus A is specified.

<3. Imaging Process for Abnormality Determination>

Using an estimated abnormal apparatus, a specified in the apparatus specification process in step S2, the unit processing A in the apparatus is performed on an inspection wafer W under a predetermined processing condition, and before and after the unit processing A is performed, the inspection wafer W is imaged by the imaging device 210 (step S3). The inspection wafer W is, for example, a bare wafer. The bare wafer refers to a wafer having a surface on which only the base of the wafer (only silicon in the case in which the wafer is a silicon wafer) is exposed.

In step S3 of this example, in addition to the estimated abnormal apparatus A, another type of predetermined processing apparatus (a different-type processing apparatus B) related to another unit processing B related to the unit processing A is controlled, and the above unit processing B is also performed on the inspection wafer W under a predetermined processing condition. For example, when the unit processing A corresponds to a resist film forming processing, the unit processing B corresponds to a PAB processing, and when the unit processing A corresponds to a PEB processing, the unit processing B corresponds to a resist film forming processing, a PAB processing, and a developing processing. Information as to which unit processing B corresponds to which unit processing A is stored in the storage unit 310.

Specifically, in step S3, first, an inspection wafer W is taken out of a cassette C on the cassette stage 12, and transported to the inspection apparatus 51 of the third block G3. Then, the inspection wafer W is imaged by the imaging device 210 of the inspection apparatus 51, and a captured image of the inspection wafer W on which neither unit processing A nor unit processing B is performed is acquired by the second acquisition unit 313. Next, the inspection wafer W is transported, for example, to one of the resist film forming apparatuses 33 as an estimated abnormal apparatus A, and a resist film forming processing as the unit processing A is performed under a predetermined processing condition. Thereafter, the inspection wafer W is transported to, for example, one of the thermal processing apparatuses 40 for a PAB processing as the different-type processing apparatus B, and a PAB processing as the unit processing B is performed under a predetermined processing condition. Next, the inspection wafer W is transported to the inspection apparatus 52 of the third block G3. Then, the inspection wafer W is imaged by the imaging device 210 of the inspection apparatus 52, and captured images of the inspection wafer W after the unit processing A by the estimated abnormal apparatus A and after the unit processing B by the different-type processing apparatus B are acquired by the second acquisition unit 313.

<4. Imaging Process for Comparison>

Next, for comparison with the imaging result acquired in step S3, the unit processing A is performed on the inspection wafer W using the other same-type processing apparatus A* under a predetermined condition, and the inspection wafer W is imaged by the imaging device 210 before and after the unit processing (step S4). The imaging process for comparison may be performed before the imaging process for abnormality determination.

In step S4 of this example, as in step S3, the different-type processing apparatus B is controlled, and the unit processing B is also performed on the inspection wafer W under a predetermined processing condition.

While the estimated abnormal apparatus A used in step S3 and the other same-type processing apparatus A* used in step S4 are different processing apparatuses of the same type, the different-type processing apparatus B used in step S3 and the different-type processing apparatus B used in step S4 are the same processing apparatus.

Specifically, in step S4, first, an inspection wafer W is taken out of a cassette C on the cassette stage 12, and transported to the inspection apparatus 51 of the third block G3. Then, the inspection wafer W is imaged by the imaging device 210 of the inspection apparatus 51, and a captured image of the inspection wafer W on which neither unit processing A nor unit processing B is performed is acquired by the third acquisition unit 314. Next, the inspection wafer W is transported, for example, to one of the resist film forming apparatuses 33 as the other same-type processing apparatus A*, and a resist film forming processing as the unit processing A is performed under a predetermined processing condition. Thereafter, the inspection wafer W is transported to, for example, one of the thermal processing apparatuses 40 for a PAB processing as the different-type processing apparatus B, and a PAB processing as the unit processing B is performed under a predetermined processing condition. Next, the inspection wafer W is transported to the inspection apparatus 52 of the third block G3. Then, the inspection wafer W is imaged by the imaging device 210 of the inspection apparatus 52, and captured images of the inspection wafer W after the unit processing A by the other same-type processing apparatus A* and after the unit processing B by the different-type processing apparatus B are acquired by the third acquisition unit 314.

<5. Abnormality Presence/Absence Determination Process>

Thereafter, based on the imaging result acquired in the imaging process for abnormality determination, the presence/absence of an actual abnormality in the estimated abnormal apparatus A is determined (step S5).

In step S5 in this example, the presence/absence of an actual abnormality in the estimated abnormal apparatus A is determined based on the captured image acquired in the imaging process for abnormality determination and the captured image acquired in the imaging process for comparison. More specifically, when both of the following items (S) and (T) are satisfied, it is determined that the estimated abnormal apparatus A actually has an abnormality.

(S) With respect to the captured images of a non-processed inspection wafer W on neither of the unit processing A and unit processing B is performed, when there is no difference between a captured image acquired in the imaging process for abnormality determination and an image acquired in the imaging process for comparison.

(T) When there is a difference between a captured image of an inspection wafer W after the unit processing A by an estimated abnormal apparatus and the unit processing B by the different-type processing apparatus B and a captured image of the inspection wafer W after the unit processing A by the other same-type processing apparatus A* and the unit processing B by the different-type processing apparatus B.

In the above items (S) and (T), "there is no difference/there is a different" means, for example, that the difference in pixel value at each coordinate of the captured image is presents/is not present within a predetermined range between the captured images.

When it is determined in step S5 that there is no actual abnormality, the wafer processing is returned to step S1, and when it is determined that there is an actual abnormality, the wafer processing proceeds to step S6.

<6. Processing Condition Correction Process>

In step S6, for the abnormal apparatus A# which is the estimated abnormal apparatus A determined to actually have an abnormality, the processing condition of the unit processing A is corrected by the processing condition correction unit 316 based on the imaging result in the imaging process for abnormality determination.

In step S6, first, for a captured image of the inspection wafer W after the unit processing A and the unit processing B, acquired in the imaging process for abnormality determination, and a similar captured image acquired in the imaging process for comparison, a deviation amount in RGB data between both captured images is calculated. Then, using a correlation model between the amount of change in RGB data in the captured images and the amount of change in the processing condition in the unit processing A, a correction amount in the processing condition of the unit processing A in the abnormal device A# is calculated based on the deviation amount in RGB data. Then, the condition currently set as a processing condition at the time of the coating and developing processing according to the unit processing A for the abnormal device A# is corrected based on the calculated correction amount.

<7. Correction Suitability Determination Process>

Then, the unit processing A is performed on a new inspection wafer W under a processing condition after correction using the abnormal device A#, the inspection wafer W is imaged by the imaging device 210 before and after the unit processing A, and it is determined whether the correction of the processing condition is suitable or not based on the imaging result (step S7).

In step S7 of this example, as in the imaging process for abnormality determination, in addition to the abnormal device A, the different-type processing apparatus B is controlled, and the unit processing B is also performed on the inspection wafer W under a predetermined processing condition.

Specifically, in step S7, first, an inspection wafer W is taken out of a cassette C on the cassette stage 12, and transported to the inspection apparatus 51 of the third block G3. Then, the inspection wafer W is imaged by the imaging device 210 of the inspection apparatus 51, and a captured image of the inspection wafer W on which neither unit processing A nor unit processing B is performed is acquired by the correction suitability determination unit 317. Next, the inspection wafer W is transported, for example, to one of the resist film forming apparatuses 33 as an abnormal apparatus A#, and a resist film forming processing as the unit processing A is performed under the predetermined processing after correction. Thereafter, the inspection wafer W is transported to, for example, one of the thermal processing apparatuses 40 for a PAB processing as the different-type processing apparatus B, and a PAB processing as the unit processing B is performed under a predetermined processing condition. Next, the inspection wafer W is transported to the inspection apparatus 52 of the third block G3. Next, the inspection wafer W is imaged by the imaging device 210 of the inspection apparatus 52, and captured images of the inspection wafer W after the unit processing A by the abnormal apparatus A# under the processing condition after correction and after the unit processing B by the different-type processing apparatus B are acquired by the correction suitability determination unit 317. Then, based on the captured image acquired in step S7 and the captured image acquired in the imaging process for comparison, it is determined whether or not the correction of the processing condition by the processing condition correction unit 316 is suitable. More specifically, when both the following items (U) and (V) are satisfied, it is determined that the correction of the processing condition is suitable.

(U) With respect to the captured images of a non-processed inspection wafer W on neither of the unit processing A and unit processing B is performed, when there is no difference between a captured image acquired in the imaging process for comparison and an image acquired in the correction suitability determination process.

(V) When there is no difference between a captured image of an inspection wafer W after the unit processing A by the other same-type processing apparatus A* and the unit processing B by the different-type processing apparatus B and a captured image of the inspection wafer W after the unit processing A by the abnormal apparatus A# and the unit processing B by the different-type processing apparatus B under the processing condition after correction.

In the above items (U) and (V), "there is no difference" means, for example, that the difference in pixel value at each coordinate of the captured image is present within a predetermined range between the captured images.

When it is determined in step S7 that the correction of the processing conditions is suitable, the wafer processing returns to step S1. Meanwhile, when it is determined that the correction of the processing condition is not suitable, a notification that it is impossible to correct the processing condition is made (step S8), the wafer processing is terminated, and the coating and developing processing on the mass production wafers W is stopped. Meanwhile, the notification method may be, for example, a method based on voice or a method based on screen display.

Next, two examples of a method of creating a correlation model between a change amount in RGB data in the captured image and a change amount in the processing condition of unit processing A will be described.

The first correlation model is a correlation model between a change amount in RGB data in the captured images and the processing rotational speed of the wafer W, which is the processing condition of the resist film forming processing, that is, the rotational speed of the spin chuck 110.

At the time of creating this correlation model, among a plurality of resist film forming apparatuses 33 and a plurality of thermal processing apparatuses 40 for a PAB processing, a combination of resist film forming apparatuses 33 used for creating the correlation model and the thermal processing apparatuses 40 for a PAB processing is determined depending on, for example, a user input.

In addition, a wafer W for creating a correlation model is taken out of a cassette C on the cassette stage 12 and transported to the inspection apparatus 51. The wafer W for creating a correlation model is, for example, a bare wafer. Thereafter, the wafer W is imaged by the imaging device 210, and a captured image is acquired.

Next, the wafer W is transported to a resist film forming apparatus 33 determined depending on, for example, the above-described user input, and a resist film is formed under the initial setting condition for creating the correlation model.

Thereafter, the wafer W is transported to a thermal processing apparatus 40 for a PAB processing determined depending on, for example, the above-mentioned user input, and is subjected to the PAB processing under a predetermined processing condition.

Next, the wafer W is transported to the inspection apparatus 52, and imaged by the imaging device 210, so that a captured image is acquired. Then, the wafer W is transported to a cassette C on the cassette stage 12.

Thereafter, the above-mentioned process is repeated multiple times. However, the above-mentioned process is repeated multiple times in the state in which the processing rotational speed of the wafer W in the resist film forming process varies each time. As a result, a plurality of pieces of information on the processing rotational speed of the wafer W are acquired, and further, a captured image captured after a processing is performed at each processing rotational speed is acquired. Then, a difference in RGB data between the captured images and a difference between the rotational speeds of the wafer W when the captured images are obtained are calculated. From this calculation result, a correlation model is created that indicates a correlation between the change amount in RGB data in the captured images and the change amount in the processing rotational speed of the wafer W. Meanwhile, the difference in RGB data between the captured images used to create the correlation model is, for example, a difference between average values of RGB data of the captured images on the entire surface of the wafer W, and is capable of being calculated based on the above-mentioned table.

The second correlation model is a correlation model that indicates, for each of the regions R1 to R5, the correlation between the change amount in RGB data in the captured images and the change amount in processing temperature of the heating plate 142 that is the processing condition of the PEB processing.

When this correlation model is created, the combination of a resist film forming apparatus 33, a thermal processing apparatus 40 for a PAB processing, a thermal processing apparatus 40 for a PEB processing, a developing apparatus 30 used for creating the correlation model is determined depending on, for example, a user input.

In addition, a wafer W for creating a correlation model is taken out of a cassette C on the cassette stage 12 and transported to the inspection apparatus 51. Thereafter, the surface of the wafer W is imaged by the imaging device 210, and a captured image is acquired.

Next, the wafer W is transported to a resist film forming apparatus 33 determined depending on, for example, the above-described user input, and a resist film is formed under the initial setting condition for creating the correlation model.

Thereafter, the wafer W is transported to a thermal processing apparatus 40 for a PAB processing determined depending on, for example, the above-mentioned user input, and is subjected to the PAB processing under a predetermined processing condition.

Next, the wafer W is transported to the exposure apparatus 4, and subjected to an exposure processing in a predetermined pattern.

Thereafter, the wafer W is transported to a thermal processing apparatus 40 for a PEB processing determined depending on, for example, the above-mentioned user input, and subjected to the PEB processing. Next, the wafer W is transported to a developing apparatus 30 determined depending on, for example, the above-mentioned user input, and subjected to the developing processing.

Next, the wafer W is transported to the inspection apparatus 52, and imaged by the imaging device 210, so that a captured image is acquired. Then, the wafer W is transported to a cassette C on the cassette stage 12.

Thereafter, the above-mentioned process is repeated multiple times. However, the above-mentioned process is repeated multiple times in the state in which the processing temperature of the heating plate 142 in the PEC processing process varies each time. As a result, a plurality of pieces of information on the processing temperature of each of the regions R1 to R5 of the heating plate 142 are acquired, and further, a captured image captured after performing the PEB processing at each processing temperature is acquired. Then, for each of the regions R1 to R5, the difference in RGB data between the captured images and the difference between the processing temperatures of the heating plate 142 when the captured images are obtained are calculated. From this calculation result, a correlation model is created that indicates, for each of regions R1 to R5, the correlation between the change amount of in RGB data in the captured images obtained from the imaging result obtained using the imaging device 210 and the change amount in the processing temperatures of the heating plate 142. Meanwhile, the difference in RGB data between the captured images of the region R1 used to create the correlation model is, for example, a difference between average values of RGB data of the captured images included in a position corresponding to the region R1, and is capable of being calculated based on the above-mentioned table. The same is applicable to the difference in RGB data between captured images of each of the regions R2 to R5.

According to the present embodiment, imaging of mass production wafers W is performed only before the start and after the completion of the coating and developing processing as a series of processing, and an estimated abnormal apparatus A is specified based on the imaging result. In addition, using the estimated abnormal apparatus A, a unit processing A in the apparatus A is performed on an inspection wafer W under a predetermined processing condition, imaging of the inspection wafer W is performed before and after performing the unit processing A, and the presence/absence of an actual abnormality in the estimated abnormal apparatus A is determined based on the imaging result. Then, based on the imaging result of the inspection wafer W, the processing condition of the unit processing A is corrected with respect to the estimated abnormal apparatus A which is determined as having an actual abnormality. Accordingly, it is possible to suitably correct a processing condition in a substrate processing system 1 having a small number of imaging devices 210. In addition, since the number of times of using the imaging devices is small, a standby time for using the imaging devices does not occur, and productivity is not impaired.

In addition, according to the present embodiment, because the correction suitability in the processing condition correction process is determined, there is no case in which the mass production process is performed after the processing condition is set incorrectly and thus wafers W are wasted.

In addition, according to the present embodiment, the presence/absence of an actual abnormality in the estimated abnormal apparatus A is determined based on the captured images of an inspection wafer W before and after performing the unit processing A using the estimated abnormal apparatus A, and the captured images of an inspection wafer W before and after performing the unit processing using the other same-type processing apparatus A*. Therefore, because it is not necessary to create a reference image for the determination of the presence/absence of an actual abnormality, it is possible to improve productivity.

Furthermore, according to the present embodiment, because bare wafers are used as inspection wafers W, it is possible to correct a processing condition at low cost.

Second Embodiment

Figure 14:
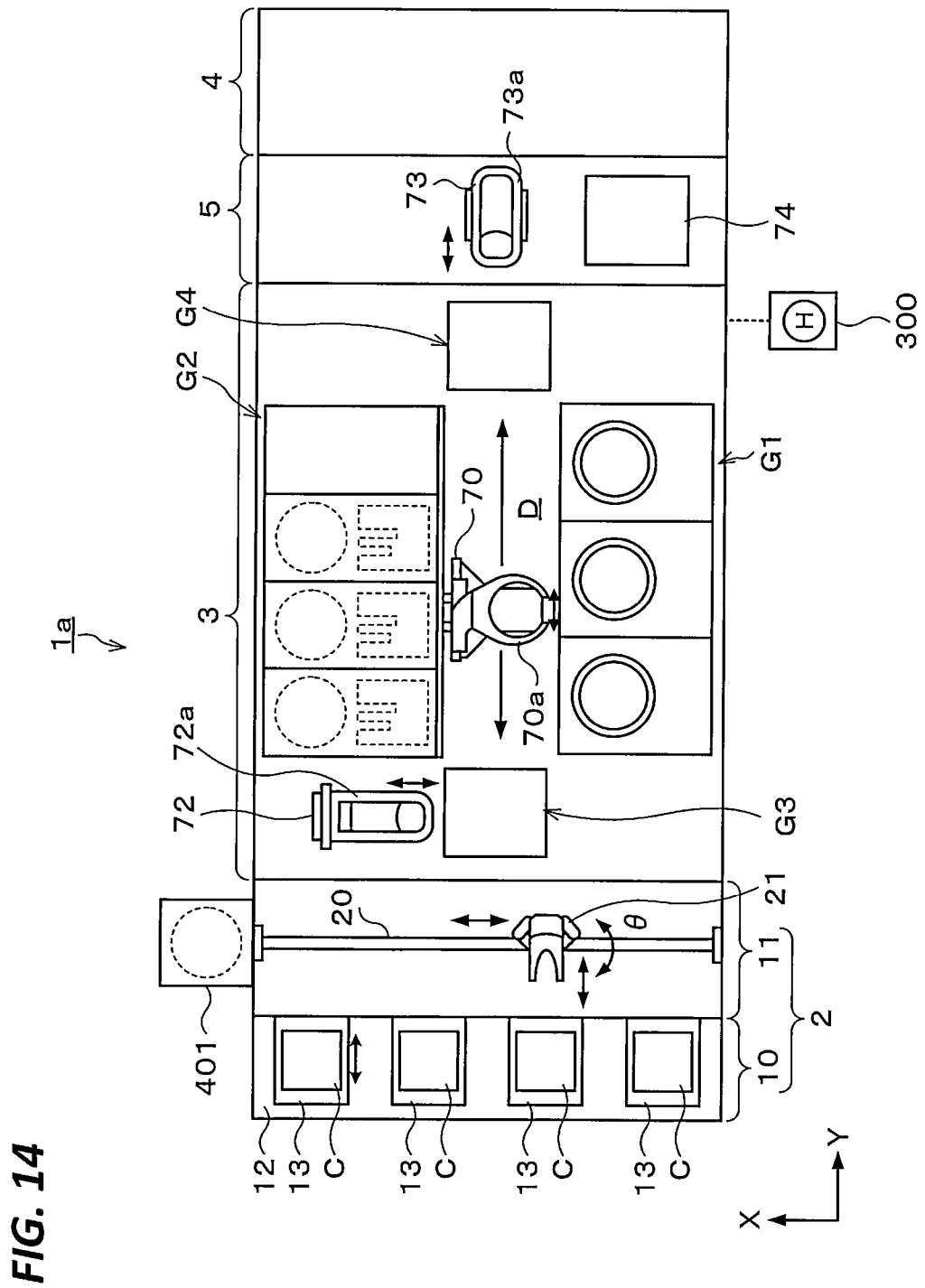
FIG. 14 is a plan view illustrating the outline of the configuration of the substrate processing system according to a second embodiment.
Figure 15:
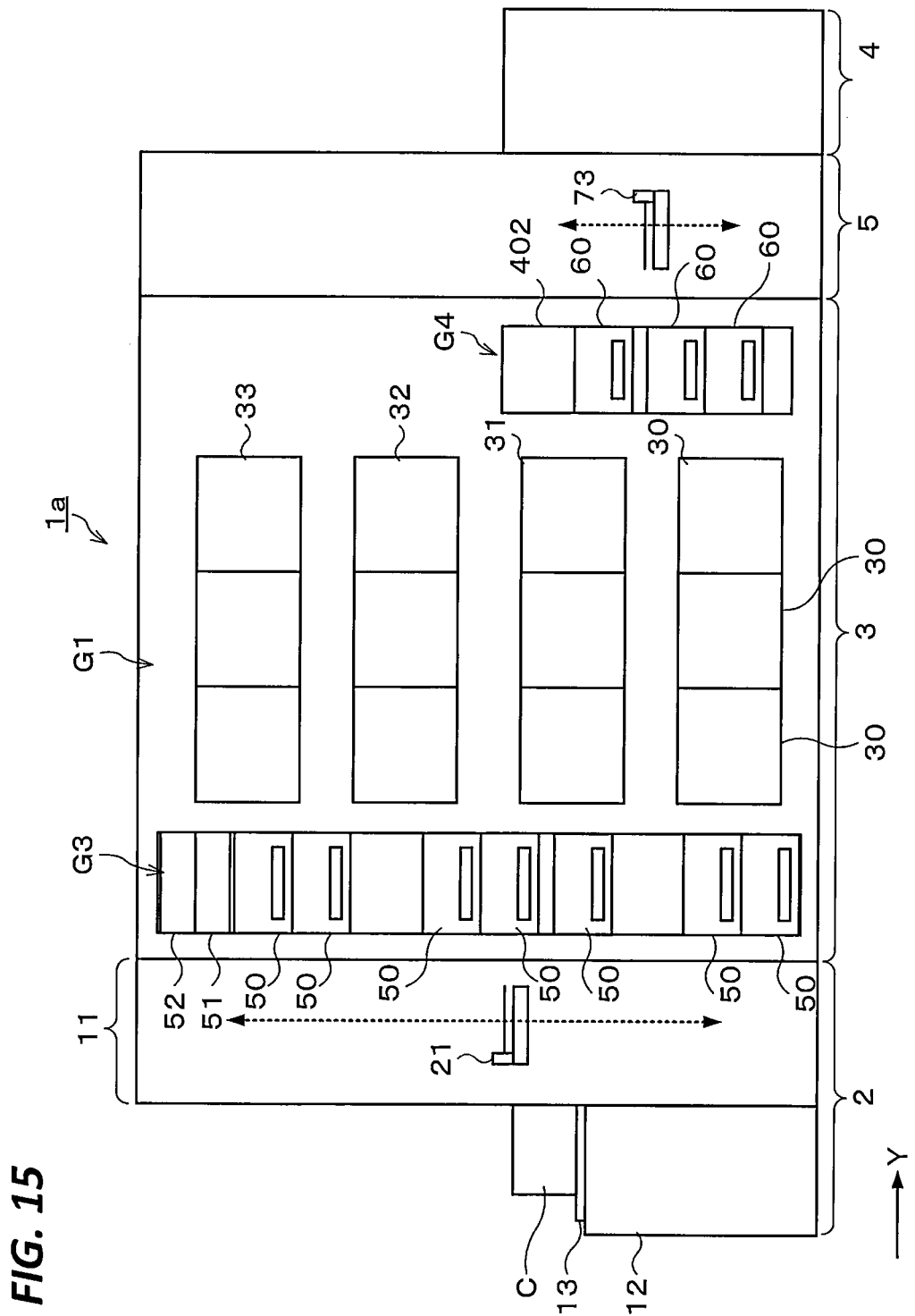
FIG. 15 is a front view illustrating the outline of the configuration of the substrate processing system according to the second embodiment.

FIG. 14 is an explanatory view illustrating the outline of the internal configuration of a substrate processing system 1a according to a second embodiment. FIG. 15 is a front view illustrating the outline of the internal configuration of the substrate processing system 1a according to the second embodiment.

In the first embodiment, inspection wafers W are accommodated in cassettes C on the cassette stage 12. In the present embodiment, as illustrated in FIG. 14, the substrate processing system 1a has a wafer accommodation unit 401 that accommodates inspection wafers W. Therefore, since it is not necessary to accommodate the inspection wafers W in the cassettes C, it is possible to increase the number of mass production wafers W placed in the cassettes. Meanwhile, in the present embodiment, the wafer accommodation unit 401 is provided on a side of the wafer transport unit 11 of the cassette station 2.

In addition, as illustrated in FIG. 15, the substrate processing system 1a has a resist film peeling apparatus 402 as a peeling apparatus. Therefore, when a resist film is formed on a bare wafer as an inspection wafer W, it is possible to reuse the bare wafer by peeling the resist film from the inspection wafer W after imaging by the resist film peeling apparatus 402. In addition, instead of the resist film peeling apparatus 402 or in addition to the resist film peeling apparatus 402, at least one of an intermediate layer film peeling apparatus for peeling an intermediate layer film and a lower layer film peeling apparatus for peeling a lower layer film may be provided. Meanwhile, without providing the resist film peeling apparatus 402, a resist film forming apparatus 33 may carry out the peeling of a resist film from a bare wafer.

In the case of peeling a layered film such as a resist film from a bare wafer as an inspection wafer W, it is preferable to image the surface of the bare wafer by an inspection apparatus 51 or an imaging device 210 of the inspection apparatus 52 after the peeling. Then, based on the imaging result, the condition of the surface of the bare wafer is confirmed, and when no layered film remains, the bare wafer may be returned to the cassette C and reused. Meanwhile, when a layered film remains, the bare wafer is re-transported to a peeling apparatus such as the resist film peeling apparatus 402, and a peeling processing is additionally performed. Thereafter, the peeling processing is repeated until the layered film disappears from the surface of the bare wafer.

As described above, even in the case of reusing a bare wafer, because no layered film remains on the surface of the bare wafer, it is possible to suitably correct a processing condition.

Meanwhile, even in the case in which a bare wafer as an inspection wafer W is accommodated in a cassette as in the first embodiment, a peeling apparatus such as the resist film peeling apparatus 402 may be provided. In this case, the layered film is peeled from the bare wafer as the inspection wafer W by the peeling apparatus, and the bare wafer after peeling is returned to the cassette C for reuse. Even in this case, it is preferable to image the surface of the bare wafer using the inspection apparatus 51 or the imaging device 210 of the inspection apparatus 52 after peeling.

Meanwhile, RGB data of captured images is used as color information having a correlation with the line width of a resist pattern and the film thickness of a resist film in the foregoing description. However, the color information having a correlation with the line width of the resist pattern and the film thickness of the resist film is not limited to RGB data. Meanwhile, the color information is brightness information of light having a specific wavelength. The color information may be luminance information of any one of R, G, and B, or may be luminance information of colors other than R, G, and B.

The substrate processing system of the above example is configured as a coating and developing system, and performs a coating and developing processing as a series of processing. However, the technology according to the present disclosure is also applicable to a substrate processing system that performs a series of processing including a film forming processing of a predetermined layered film such as, for example, a TiN film on a wafer W in a decompressed atmosphere, and an etching processing on a layered film on a wafer W in a decompressed atmosphere. In this case, the processing condition correction method according to the present disclosure may be used for the correction of a processing condition in a film forming processing performed under a decompressed atmosphere or the correction of a processing condition in an etching processing performed under a decompressed atmosphere.

The following configurations also belong to the technical scope of the present disclosure.

(1) A method for correcting a processing condition in a substrate processing system, the substrate processing system including: a plurality of processing apparatuses, each of which performs a unit processing constituting a series of processings in which each of formation and removal of a layered film on a substrate is performed once or more or any one of formation and removal of a layered film is performed multiple times; and an imaging device that images the substrate, the method including imaging the substrate for monitoring using the imaging device before start and after completion of the series of processings on each substrate; specifying a processing apparatus estimated as having an abnormality, based on an imaging result acquired in the imaging and information on the processing apparatus used in the series of processings; performing, using the processing apparatus specified in the specifying, the unit processing in the processing apparatus on an inspection substrate under a predetermined processing condition, and imaging the inspection substrate for determining an abnormality by the imaging device before and after performing the unit processing; determining presence/absence of an actual abnormality in the processing apparatus specified in the specifying, based on an imaging result in the imaging the inspection substrate for determining an abnormality; and correcting, with respect to the processing apparatus determined as having the actual abnormality in the determining presence/absence of an actual abnormality, the processing condition of the unit processing in the processing apparatus based on the imaging result in the imaging the inspection substrate for determining an abnormality.

In the item (1), the imaging is performed only before the start and after the completion of the series of processings, and the processing apparatus estimated as having the abnormality is specified based on the imaging result. Further, the unit processing in the specified processing apparatus is performed on the inspection substrate under the predetermined processing condition using the specified processing apparatus, and the presence/absence of the actual abnormality in the specified processing apparatus is determined based on the imaging result of the inspection substrate. Then, based on the imaging result of the inspection substrate, the processing condition of the unit processing is corrected with respect to the processing apparatus that is determined as having the actual abnormality. Accordingly, it is possible to suitably correct a processing condition in the substrate processing system having a small number of imaging devices. In addition, since the number of times of using the imaging devices is small, a standby time for using the imaging devices does not occur, and productivity is not impaired.

(2) The method described in item (1), further including: performing, using the processing apparatus determined as having the actual abnormality in the determining, the unit processing in the processing apparatus on the inspection substrate under the processing condition after correction, imaging the inspection substrate using the imaging device to acquire an imaging result of the inspection substrate, and determining suitability of the correction in the correcting, based on the imaging result of the inspection substrate.

(3) The method described in item (1) or (2), further including: performing, using another processing apparatus performing the same unit processing as the processing apparatus specified in the specifying, the unit processing in the processing apparatus on an inspection substrate under a predetermined processing condition, and imaging the inspection substrate for comparison by the imaging device before and after performing the unit processing to acquire an imaging result of the inspection substrate, in which, the determining determines the presence/absence of the actual abnormality based on the imaging result in the imaging the inspection substrate for determining an abnormality and the imaging result in the imaging the inspection substrate for comparison.

(4) The method described in any one of items (1) to (3), in which the bare wafer is accommodated in the substrate processing system.

(5) The method described in item (4), in which the bare wafer is accommodated in the substrate processing system.

(6) The method described in item (4) or (5), in which the layered film formed on the bare wafer is peeled off by a peeling apparatus after being imaged by the imaging device.

(7) The method described in item (6), the bare wafer after the peeling off is imaged by the imaging device.

(8) A substrate processing system including: a plurality of processing apparatuses each configured to perform a unit processing including a series of processings in which both or either of formation and removal of a layered film on a substrate is performed once or more or any one of formation and removal of a layered film is performed multiple times; an imaging device configured to image the substrate; and a controller coupled to a memory and configured to: acquire a first imaging result by the imaging device with respect to each substrate before start and after completion of the series of processings on each substrate; specify a processing apparatus estimated as having an abnormality, based on the first imaging result and information on the processing apparatus used in the series of processings; using the specified processing apparatus, perform the unit processing in the processing apparatus on an inspection substrate under a predetermined processing condition, and acquire a second imaging result by the imaging device on the inspection substrate before and after performing the unit processing; determine presence/absence of an actual abnormality in the specified processing apparatus based on the second imaging result; and correct, with respect to the processing apparatus determined as having the actual abnormality, the processing condition of the unit processing in the processing apparatus based on the second imaging result.

According to the present disclosure, in a substrate processing system having a small number of imaging devices, it is possible to suitably correct processing conditions without losing productivity.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method for a substrate processing system, the method comprising:
imaging a substrate for monitoring using a camera before start and after completion of a series of processings on the substrate;
specifying a first processing apparatus estimated as having a potential abnormality among a plurality of processing apparatuses including at least one film applier and at least one heat applier, the plurality of processing apparatuses being configured to perform the series of processings in the substrate processing system based on an initial imaging result acquired in the imaging of the substrate and information on the plurality of processing apparatuses used in the series of processings;
performing a first process on a first inspection substrate under a selected processing condition using the first processing apparatus specified in the specifying, wherein the first process being separate from the series of processings, and imaging the first inspection substrate for determining an abnormality using the camera before and after the performing the first process to acquire a first imaging result for the first inspection substrate;
performing a second process on a second inspection substrate using a second processing apparatus among the plurality of processing apparatuses, the second processing apparatus performing a same type of process as the first processing apparatus specified in the specifying, and imaging the second inspection substrate for comparison using the camera before and after the performing the second process to acquire a second imaging result for the second inspection substrate; and
determining whether an actual abnormality exists in the first processing apparatus specified in the specifying, based on the first imaging result acquired in the imaging of the first inspection substrate for determining an abnormality and the second imaging result acquired in the imaging of the second inspection substrate for comparison.

2. The method according to claim 1, further comprising:
correcting a processing condition of the first processing apparatus specified in the specifying and determined as having the actual abnormality in the determining based on the first imaging result acquired in the imaging the first inspection substrate for determining an abnormality; and
performing a third process on a third inspection substrate under the processing condition corrected from the correcting using the first processing apparatus determined as having the actual abnormality in the determining, imaging the third inspection substrate using the camera to acquire a third imaging result for the third inspection substrate, and determining whether a correction in the correcting is suitable based on the third imaging result acquired in the imaging of the third inspection substrate.

3. The method according to claim 1, wherein a processing apparatus different from the first processing apparatus is used in the first process of the imaging for determining an abnormality among the series of processings,
a processing apparatus different from the second processing apparatus is used in the second process of the imaging for comparison among the series of processings, and
the processing apparatus different from the first processing apparatus used in the first process is same as the processing apparatus different from the second processing apparatus used in the second process.

4. The method according to claim 1, wherein the inspection substrate is a bare wafer.

5. The method according to claim 4, wherein the bare wafer is accommodated in the substrate processing system.

6. The method according to claim 4, wherein a layered film formed on the bare wafer is peeled off by a peeler after being imaged by the camera.

7. The method according to claim 6, wherein the bare wafer is imaged by the camera after the layered film is peeled off.

8. A substrate processing system comprising:
a plurality of processing apparatuses including at least one film applier and at least one heat applier, the plurality of processing apparatuses being configured to perform a series of processings in which both or either of formation and removal of a layered film on a substrate is performed once or more, or any one of formation and removal of a layered film on the substrate is performed multiple times;
a camera configured to image the substrate; and
a controller configured to control an overall operation of the substrate processing system that performs a process including:
imaging the substrate for monitoring using the camera before start and after completion of the series of processings on the substrate;
specifying a first processing apparatus estimated as having a potential abnormality among a plurality of processing apparatuses including at least one film applier and at least one heat applier, the plurality of processing apparatuses being configured to perform the series of processings in the substrate processing system based on an initial imaging result acquired in the imaging of the substrate and information on the plurality of processing apparatuses used in the series of processings;
performing a first process on a first inspection substrate under a selected processing condition using the first processing apparatus specified in the specifying, wherein the first process being separate from the series of processings, and imaging the first inspection substrate for determining an abnormality using the camera before and after the performing the first process to acquire a first imaging result for the first inspection substrate;
performing a second process on a second inspection substrate using a second processing apparatus among the plurality of processing apparatuses, the second processing apparatus performing a same type of process as the first processing apparatus specified in the specifying, and imaging the second inspection substrate for comparison using the camera before and after the performing the second process to acquire a second imaging result for the second inspection substrate; and
determining whether an actual abnormality exists in the first processing apparatus specified in the specifying, based on the first imaging result acquired in the imaging of the first inspection substrate for determining an abnormality and the second imaging result acquired in the imaging of the second inspection substrate for comparison.

9. The substrate processing system according to claim 8, wherein the process further includes:
correcting a processing condition of the first processing apparatus specified in the specifying and determined as having the actual abnormality in the determining based on the first imaging result acquired in the imaging the first inspection substrate for determining an abnormality; and
performing a third process on a third inspection substrate under the processing condition corrected from the correcting using the first processing apparatus determined as having the actual abnormality in the determining, imaging the third inspection substrate using the camera to acquire a third imaging result for the third inspection substrate, and determining whether a correction in the correcting is suitable based on the third imaging result acquired in the imaging of the third inspection substrate.

10. The substrate processing system according to claim 8, wherein a processing apparatus different from the first processing apparatus is used in the first process of the imaging for determining an abnormality among the series of processings,
a processing apparatus different from the second processing apparatus is used in the second process of the imaging for comparison among the series of processings, and
the processing apparatus different from the first processing apparatus used in the first process is same as the processing apparatus different from the second processing apparatus used in the second process.

11. The substrate processing system according to claim 8, wherein the inspection substrate is a bare wafer.

12. The substrate processing system according to claim 11, wherein the bare wafer is accommodated in the substrate processing system.

13. The substrate processing system according to claim 11, wherein a layered film formed on the bare wafer is peeled off by a peeler after being imaged by the camera.

14. The substrate processing system according to claim 13, wherein the bare wafer is imaged by the camera after the layered film is peeled off.

* * * * *